(12) United States Patent
Jeong et al.

(10) Patent No.: US 11,848,382 B2
(45) Date of Patent: Dec. 19, 2023

(54) SEMICONDUCTOR DEVICE

(71) Applicant: SAMSUNG ELECTRONICS CO., LTD., Suwon-si (KR)

(72) Inventors: Jinwoo Jeong, Suwon-si (KR); Jaehyoung Lim, Anyang-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/734,686

(22) Filed: May 2, 2022

(65) Prior Publication Data

US 2022/0262944 A1 Aug. 18, 2022

Related U.S. Application Data

(63) Continuation of application No. 16/781,991, filed on Feb. 4, 2020, now Pat. No. 11,322,616.

(30) Foreign Application Priority Data

Jul. 25, 2019 (KR) .......................... 10-2019-0090366

(51) Int. Cl.
| | |
|---|---|
| H01L 29/78 | (2006.01) |
| H01L 21/8234 | (2006.01) |
| H01L 21/8238 | (2006.01) |
| H01L 29/66 | (2006.01) |
| H01L 27/092 | (2006.01) |
| H01L 27/12 | (2006.01) |
| H01L 29/06 | (2006.01) |

(52) U.S. Cl.
CPC .... *H01L 29/785* (2013.01); *H01L 21/823481* (2013.01); *H01L 21/823821* (2013.01); *H01L 21/823828* (2013.01); *H01L 21/823878* (2013.01); *H01L 27/0924* (2013.01); *H01L 27/1211* (2013.01); *H01L 29/0653* (2013.01); *H01L 29/66795* (2013.01)

(58) Field of Classification Search
CPC ............... H01L 29/785; H01L 29/0653; H01L 21/823481; H01L 21/823821; H01L 21/823828; H01L 21/823878; H01L 27/0924; H01L 27/1211
See application file for complete search history.

(56) References Cited

U.S. PATENT DOCUMENTS

| | | | |
|---|---|---|---|
| 9,716,106 B2 | 7/2017 | Baek et al. | |
| 9,780,033 B2 | 10/2017 | Yoon et al. | |
| 9,793,174 B1 * | 10/2017 | Huang | .................. H01L 29/785 |

(Continued)

*Primary Examiner* — Christine A Enad
(74) *Attorney, Agent, or Firm* — Fish & Richardson P.C.

(57) ABSTRACT

A semiconductor device includes a substrate that includes a first active region and a second active region, a device isolation layer between the first active region and the second active region, a gate structure that extends in a first direction and runs across the first active region and the second active region, a first active contact pattern on the first active region on one side of the gate structure, a second active contact pattern on the second active region on another side of the gate structure, and a connection pattern that is on the device isolation layer and connects the first active contact pattern and the second active contact pattern to each other. The connection pattern extends in a second direction and runs across the gate structure. Portions of the first active contact pattern and the second active contact pattern extend in the first direction and overlap the device isolation layer.

19 Claims, 24 Drawing Sheets

(56) References Cited

U.S. PATENT DOCUMENTS

| | | |
|---|---|---|
| 2013/0026571 A1* | 1/2013 | Kawa .................... G06F 30/392 |
| | | 257/E21.602 |
| 2013/0026572 A1 | 1/2013 | Kawa et al. |
| 2013/0069170 A1 | 3/2013 | Blatchford |
| 2018/0102363 A1* | 4/2018 | Li ........................ H01L 21/762 |
| 2018/0102364 A1 | 4/2018 | Rastogi et al. |
| 2019/0080969 A1 | 3/2019 | Tsao |
| 2019/0080998 A1 | 3/2019 | Rastogi et al. |
| 2019/0279912 A1* | 9/2019 | Loubet .................. H01L 21/308 |
| 2020/0365589 A1* | 11/2020 | Liaw ................... H01L 27/0207 |

\* cited by examiner

SEMICONDUCTOR DEVICE

CROSS-REFERENCE TO RELATED APPLICATION

This is a Continuation of U.S. application Ser. No. 16/781,991, filed Feb. 4, 2020, and a claim of priority under 35 U.S.C § 119 to Korean Patent Application No. 10-2019-0090366, filed on Jul. 25, 2019 in the Korean Intellectual Property Office, the entire contents of which are hereby incorporated by reference.

BACKGROUND

1. Technical Field

The present disclosure relates to a semiconductor device. More particularly, the present disclosure relates to a semiconductor device including a field effect transistor.

2. Description of the Related Art

A semiconductor device includes an integrated circuit consisting of metal oxide semiconductor field effect transistors (MOSFETs). As the semiconductor device becomes highly integrated, the scale down of the MOSFETs is also being accelerated, and thus operating characteristics of the semiconductor device may deteriorate. Therefore, various efforts including studies have been made with a goal of manufacturing the semiconductor device having superior performances while overcoming limitations due to high integration of the semiconductor device.

SUMMARY

Some example embodiments of the inventive concepts described herein provide a semiconductor device including highly-integrated field effect transistors.

Objects of the inventive concepts described herein are not limited to those mentioned above, and other objects which have not been mentioned above will be clearly understood to those skilled in the art from the following description.

According to some example embodiments of the present disclosure, a semiconductor device may include a substrate, a device isolation layer, a gate structure, a first active contact pattern, a second active contact pattern, and a connection pattern. The substrate includes a first active region and a second active region. The device isolation layer is between the first active region and the second active region. The gate structure extends in a first direction and runs across the first active region and the second active region. The first active contact pattern is on the first active region on one side of the gate structure. The second active contact pattern is on the second active region on another side of the gate structure. The connection pattern is on the device isolation layer and connects the first active contact pattern and the second active contact pattern to each other. The connection pattern extends in a second direction and runs across the gate structure. Portions of the first active contact pattern and the second active contact pattern may extend in the first direction and may overlap the device isolation layer.

According to some example embodiments of the present disclosure, a semiconductor device may include a substrate, multiple first active patterns, multiple second active patterns, a gate structure, a first active contact pattern, a second active contact pattern, a third active contact pattern, a fourth active contact pattern, and a connection pattern. The substrate includes a first active region and a second active region. The first active patterns are on the first active region and extend in a first direction. The second active patterns are on the second active region and extend in the first direction. The gate structure runs across the first active patterns and the second active patterns and extends in a second direction intersecting the first direction. The first active contact pattern is on the first active patterns on one side of the gate structure. The first active contact pattern has a first length in the second direction. The second active contact pattern is on the first active patterns on another side of the gate structure. The second active contact pattern has a second length in the second direction. The second length is greater than the first length. The third active contact pattern is on the second active patterns on one side of the gate structure. The third active pattern has the second length. The fourth active contact pattern is on the second active patterns on another side of the gate structure. The fourth active contact pattern has the first length. The connection pattern extends in the first direction and runs across the gate structure between the first active region and the second active region. The connection pattern connects the second active contact pattern to the third active contact pattern.

Details of other example embodiments are included in the description and drawings.

DETAILED DESCRIPTION OF EMBODIMENTS

A semiconductor device according to some example embodiments of the inventive concepts described herein will be described below in detail with reference to the accompanying drawings.

Before proceeding, it will be understood that, although the terms first, second, third etc. may be used herein to describe various items such as directions, elements or components, these directions, elements or components should not be limited by these terms. These terms are only used to distinguish one element or component from another element or component. Thus, a first direction, element or component discussed below in the detailed description could be termed a second direction, element or component in the appended claims without departing from the teachings of the present disclosure.

Additionally, unless otherwise noted, when an element or component is said to be "connected to", "coupled to", "under", "over" or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

A fin field effect transistor (FinFET) including a fin-type channel region is exemplarily illustrated as a semiconductor device according to some example embodiments, but the present disclosure is not limited thereto. A semiconductor device according to some example embodiments of the present disclosure may include, a tunneling field effect transistor, a nano-wire transistor, a nano-sheet transistor (or a multi-bridge channel field effect transistor (MBCFBT)), or a three-dimensional (3D) transistor. Alternatively, a semiconductor device according to some example embodiments of the present disclosure may include a bipolar junction transistor or a lateral double-diffused metal-oxide-semiconductor (LDMOS) transistor.

Figure 1:
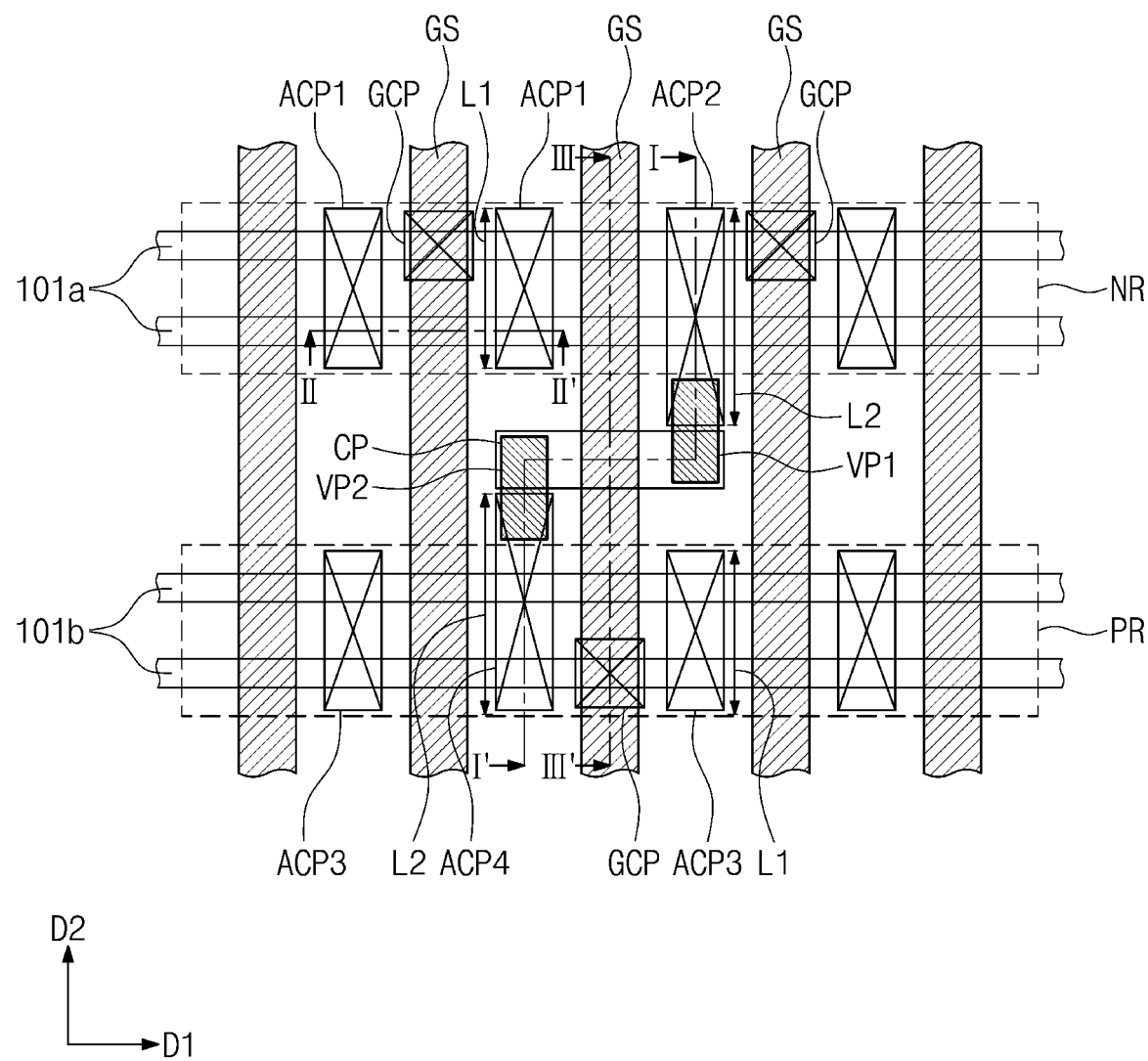
FIG. 1 illustrates a plan view showing a semiconductor device according to some example embodiments of the present disclosure.
Figure 2A:
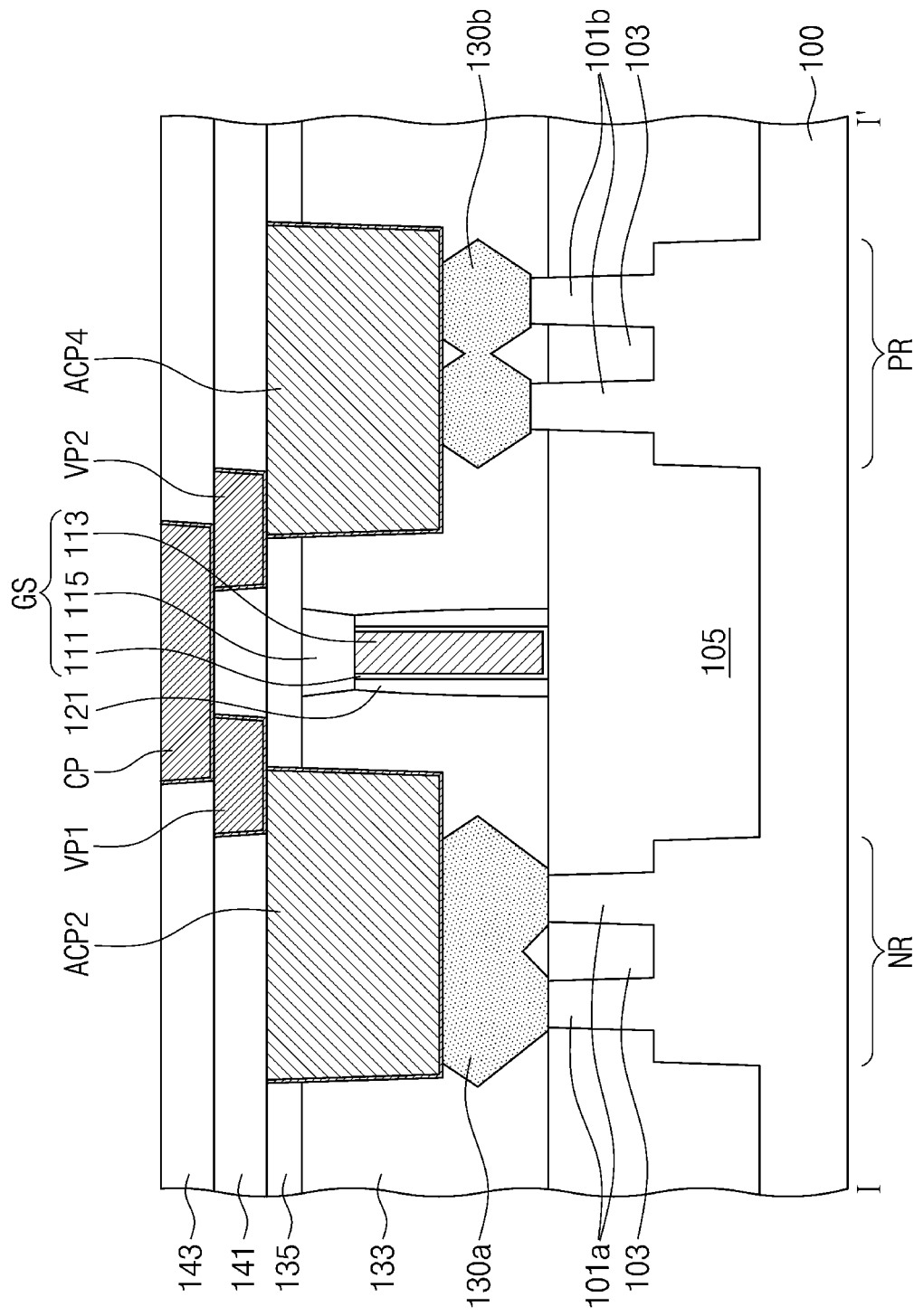
FIG. 2A illustrates a cross-sectional view taken along line I-I' of FIG. 1, showing a semiconductor device according to some example embodiments of the present disclosure.
Figure 2B:
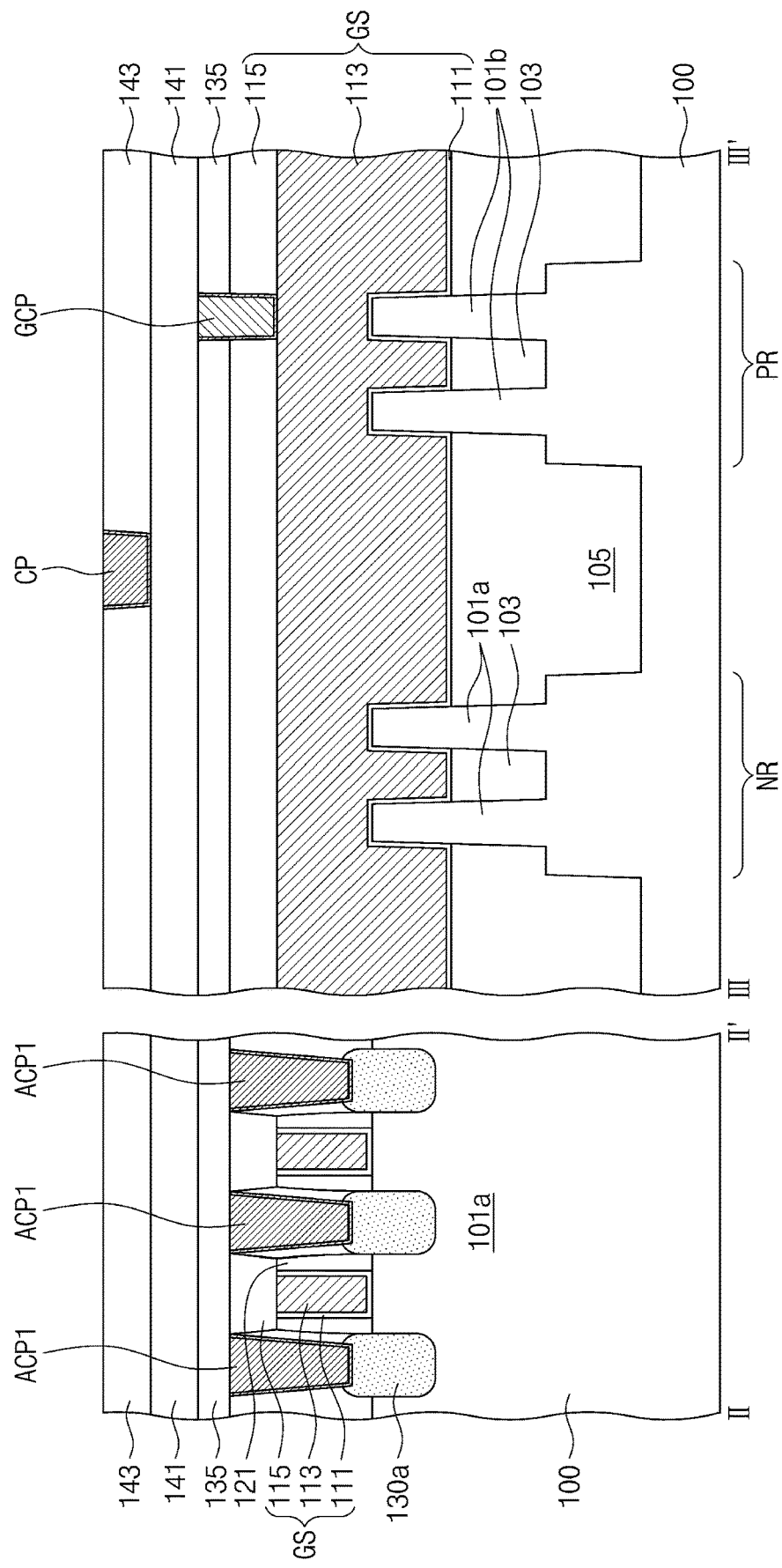
FIG. 2B illustrates a cross-sectional view taken along lines II-II' and of FIG. 1, showing a semiconductor device according to some example embodiments of the present disclosure.
Figure 2C:
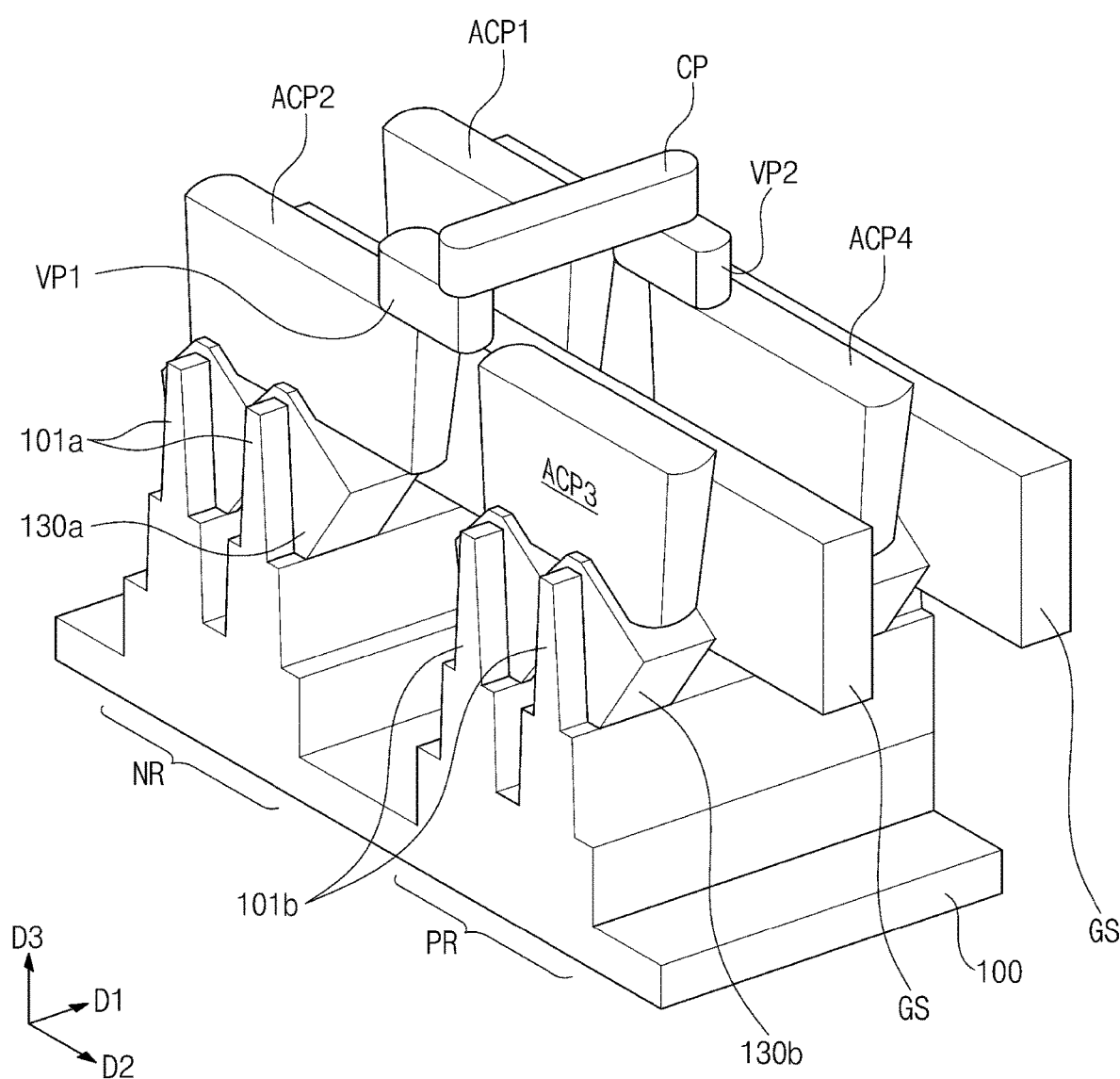
FIG. 2C illustrates a perspective view showing the semiconductor device depicted in FIGS. 1, 2A, and 2B.

FIG. 1 illustrates a plan view showing a semiconductor device according to some example embodiments of the present disclosure. FIG. 2A illustrates a cross-sectional view taken along line I-I' of FIG. 1, showing a semiconductor device according to some example embodiments of the present disclosure. FIG. 2B illustrates a cross-sectional view taken along lines II-II' and of FIG. 1, showing a semiconductor device according to some example embodiments of the present disclosure. FIG. 2C illustrates a perspective view showing the semiconductor device depicted in FIGS. 1, 2A, and 2B.

Referring to FIGS. 1, 2A, 2B, and 2C, a semiconductor substrate 100 may be a compound semiconductor substrate or a semiconductor substrate including silicon, germanium, silicon-germanium, etc. For example, the semiconductor substrate 100 may be a silicon substrate.

The semiconductor substrate 100 may include a first active region NR and a second active region PR. The first active region NR and the second active region PR may be included in logic cell areas each of which includes logic transistors constituting a logic circuit of a semiconductor device. For example, PMOS field effect transistors may be provided in or on the first active region NR, and NMOS field effect transistors may be provided in or on the second active region PR. The semiconductor substrate 100 may include dopants whose conductive types are opposite to each other at the first active region NR and the second active region PR.

On or in the first active region NR, more than one first active pattern 101a may extend in a first direction D1 as part of the first active region NR of the semiconductor substrate 100. For example, each first active pattern 101a may have a primary dimension in the first direction D1 that is larger than any dimension in planes perpendicular to the first direction D1. Each first active pattern 101a may be spaced apart from each other first active pattern 101a in a second direction D2 intersecting the first direction D1. On or in the second active region PR, more than one second active pattern 101b may extend in the first direction D1 as part of the second active region PR of the semiconductor substrate 100. For example, each second active pattern 101b may have a primary dimension in the first direction D1 that is larger than any dimension in planes perpendicular to the first direction D1. Each second active pattern 101b may be spaced apart from each other second active pattern 101b in the second direction D2 intersecting the first direction D1. The first active patterns 101a and the second active patterns 101b may be portions of the semiconductor substrate 100 and may be defined by first trenches formed on the semiconductor substrate 100. In an embodiment, although the number of first active pattern 101a is illustrated as being provided twice, the inventive concepts of the present disclosure are not limited thereto, and the number of the first active pattern 101a may be variously changed. The same may be true for the second active pattern 101b.

A first device isolation layer 103 may be disposed between the first active patterns 101a and between the second active patterns 101b. The first device isolation layer 103 may separate the first active patterns 101a and the second active patterns 101b from each other in the second direction D2. The first device isolation layer 103 may expose upper portions of the first active patterns 101a and the second active patterns 101b. For example, the first device isolation layer 103 may have a top surface lower than those of the first active patterns 101a and the second active patterns 101b, and the upper portions of the first active patterns 101a and the second active patterns 101b may upwardly protrude beyond the top surface of the first device isolation layer 103.

A second device isolation layer 105 may extend in the first direction D1, and may define the first active region NR and the second active region PR. For example, the second device isolation layer 105 may have a primary dimension in the first direction D1 that is larger than any dimension in planes perpendicular to the first direction D1. The second device isolation layer 105 may be provided between the first active region NR and the second active region PR. For example, the second device isolation layer 105 may be provided between the first active patterns 101a of (in or on) the first active region NR and the second active patterns 101b of (in or on) the second active region PR. The second device isolation layer 105 may have a width in the second direction D2 greater than a width in the second direction of the first device isolation layer 103. The second device isolation layer 105 may have a bottom surface at a level lower than or substantially the same as that of a bottom surface of the first device isolation layer 103. The second device isolation layer 105 may separate the first active region NR and the second active region PR from each other in the second direction D2.

Gate structures GS may extend in the second direction D2 and run across the first active region NR and the second active region PR. For example, the gate structures GS may directly contact the first active patterns 101a and the second active patterns 101b of the first active region NR and the second active region PR while passing over the remainder of the first active region NR and the second active region PR without contact as shown in FIG. 2B. For example, the gate structures GS may have a primary dimension in the second direction D2 that is larger than any dimension in planes perpendicular to the second direction D2. The gate structures GS may be arranged at a regular pitch. For example, the gate structures GS may have substantially the same width and may be spaced apart from each other at a regular interval.

Each of the gate structures GS may include a gate dielectric layer 111, a gate conductive pattern 113, and a capping dielectric pattern 115. Gate spacers 121 may be disposed on opposite sidewalls of each of the gate structures GS.

The gate dielectric layer 111 may extend along the second direction D2 and may conformally cover the upper portions of the first active patterns 101a and the second active patterns 101b. For example, the gate dielectric layer 111 may have a primary dimension in the second direction D2 that is larger than any dimension in planes perpendicular to the second direction D2. The gate dielectric layer 111 may extend from between the gate conductive pattern 113 and the first active patterns 101a and the second active patterns 101b to between the gate conductive pattern 113 and the gate spacers 121. For example, the gate dielectric layer 111 may extend from a bottom surface of the gate conductive pattern 113 onto opposite sidewalls of the gate conductive pattern 113. The gate dielectric layer 111 may include a high-k dielectric material whose dielectric constant is greater than that of silicon oxide. The gate dielectric layer 111 may include, for example, metal oxide, metal silicate, or metal silicate nitride.

The gate conductive pattern 113 may include a barrier metal pattern and a metal pattern. The barrier metal pattern may include conductive metal nitride (e.g., titanium nitride, tantalum nitride, and/or tungsten nitride). The metal pattern may include a metallic material (e.g., tungsten, aluminum, titanium, and/or tantalum).

The capping dielectric pattern 115 may cover a top surface of the gate conductive pattern 113. The capping dielectric pattern 115 may have a top surface substantially coplanar with that of a gap-fill dielectric layer 133 which will be discussed below. The capping dielectric pattern 115 may include, for example, silicon oxide, silicon nitride, silicon oxynitride, silicon carbon nitride (SiCN), or silicon carbon oxynitride (SiCON). The gate spacers 121 may include a dielectric material, such as silicon oxide or silicon nitride.

First source/drain patterns 130a may be disposed on the upper portions of the first active patterns 101a on opposite sides of each of the gate structures GS. The first active patterns 101a may have their portions (or channel regions) positioned between the first source/drain patterns 130a that are horizontally spaced apart from each other.

Second source/drain patterns 130b may be disposed on the upper portions of the second active patterns 101b on opposite sides of each of the gate structures GS. The second active patterns 101b may have their portions (or channel regions) positioned between the second source/drain patterns 130b that are horizontally spaced apart from each other.

The first source/drain patterns 130a may include p-type impurities on the first active region NR, and the second source/drain patterns 130b may include n-type impurities on the second active region PR. For example, the first source/drain patterns 130a and the second source/drain patterns 130b may be epitaxial patterns grown from the first active patterns 101a and the second active patterns 101b. The first source/drain patterns 130a may be silicon-germanium (SiGe) epitaxial layers on the first active region NR, and the second source/drain patterns 130b may be silicon carbide (SiC) epitaxial layers on the second active region PR. The first source/drain patterns 130a may have their volumes greater than those of the second source/drain patterns 130b. Lowermost points of the first source/drain patterns 130a may be lower than those of the second source/drain patterns 130b.

A gap-fill dielectric layer 133 may fill a gap between the gate structures GS and may cover the first source/drain pattern 130a and the second source/drain pattern 130b. For example, the gap-fill dielectric layer 133 may have a top surface substantially coplanar with those of the gate structures GS.

The gap-fill dielectric layer 133 may be provided thereon with a first interlayer dielectric layer 135 that covers the top surfaces of the gate structures GS. The gap-fill dielectric layer 133 and the first interlayer dielectric layer 135 may be formed of a dielectric material having an etch selectivity with respect to the gate spacers 121, and may include one or more of a silicon oxide layer, a silicon nitride layer, a silicon oxynitride layer, and a low-k dielectric layer.

On the first active region NR, first active contact patterns ACP1 and the second active contact pattern ACP2 may penetrate the first interlayer dielectric layer 135 and the gap-fill dielectric layer 133. In the Figures and description herein, the second active contact pattern ACP2 is shown as and referred to primarily in the singular; however, in embodiments more than one second active contact pattern ACP2 may be provided on the second active region PR. The first active contact patterns ACP1 and the second active contact pattern ACP2 may be coupled to the first source/drain patterns 130a.

Each of the first active contact patterns ACP1 and the second active contact pattern ACP2 may extend in the second direction D2 and may be disposed on multiple first active patterns 101a. For example, each of the first active contact patterns ACP1 and the second active contact pattern ACP2 may have a primary dimension in the second direction D2 that is larger than any dimension in planes perpendicular to the second direction D2. The first active contact patterns ACP1 may each have a first length L1 in the second direction D2, and the second active contact pattern ACP2 may each have a second length L2 in the second direction D2 greater than the first length L1. As shown in FIG. 2A and FIG. 2C, the second active contact pattern ACP2 may extend onto (over) the second device isolation layer 105 in a third direction D3 that is perpendicular to a plane formed by the first direction D1 and the second direction D2. The second active contact pattern ACP2 may include a portion that overlaps the second device isolation layer 105 by being directly or indirectly over the second device isolation layer 105 in the third direction D3. For example, one of the first active contact patterns ACP1 may be disposed on one side of one of the gate structures GS, and the second active contact pattern ACP2 may be disposed on another side of the same gate structure GS. The other side of the same gate structure GS may be an opposite side of the one side on which the one of the first active contact patterns ACP1 is disposed. As a result, one of the first active contact patterns ACP1, one of the gate structures GS and the second active contact pattern ACP2 may be arranged in order in the first direction D1.

On the second active region PR, the third active contact patterns ACP3 and the fourth active contact pattern ACP4 may penetrate the first interlayer dielectric layer 135 and the gap-fill dielectric layer 133 and may be coupled to the second source/drain patterns 130b. In the Figures and description herein, the fourth active contact pattern ACP4 is shown as and referred to primarily in the singular; however, in embodiments more than one fourth active contact pattern ACP4 may be provided on the second active region PR. Each of the third active contact patterns ACP3 and the fourth active contact pattern ACP4 may extend in the second direction D2 and may be disposed on multiple second active patterns 101b. For example, each of the third active contact patterns ACP3 and the fourth active contact pattern ACP4 may have a primary dimension in the second direction D2 that is larger than any dimension in planes perpendicular to the second direction D2. The third active contact patterns ACP3 may each have the first length L1 in the second direction D2, and the fourth active contact pattern ACP4 may have the second length L2 in the second direction D2 greater than the first length L1. The fourth active contact pattern ACP4 may extend onto (over) the second device isolation layer 105 in the third direction D3. The fourth active contact pattern ACP4 may include a portion that overlaps the second device isolation layer 105 by being directly or indirectly over the second device isolation layer 105 in the third direction D3. For example, the fourth active contact pattern ACP4 may be disposed on one side of one of the gate structures GS, and one of the third active contact patterns ACP3 may be disposed on another side of one of the same gate structures GS. The other side of the same gate structure GS may be an opposite side of the one side on which the fourth active contact pattern ACP4 is disclosed.

As set forth above, the first active contact patterns ACP1 and the second active contact pattern ACP2 are provided on the first active region NR. The third active contact pattern ACP3 and the fourth active contact pattern ACP4 are provided on the second active region PR. As shown in FIG. 1, the second active contact pattern ACP2 is provided on the first active region NR on one side of the gate structure GS in the middle of the three that are labelled. The fourth active contact pattern ACP4 is provided on the second active region PR on the other side of the same gate structure GS in the middle of the three that are labelled. The other side of the same gate structure GS may be the opposite side of the one side of the gate structure GS on which the second active contact pattern ACP2 is provided.

The first active contact patterns ACP1, the second active contact pattern ACP2, the third active contact patterns ACP3, and the fourth active contact pattern ACP4 may include one or more of metal (e.g., tungsten, titanium, tantalum, and cobalt) and conductive metal nitride (e.g., titanium nitride, tantalum nitride, and tungsten nitride).

Gate contact patterns GCP may be correspondingly coupled to the gate conductive patterns 113 of the gate structures GS. The gate contact patterns GCP may penetrate the first interlayer dielectric layer 135, the gap-fill dielectric layer 133, and the capping dielectric pattern 115 of the gate structure GS. The gate contact patterns GCP may be formed simultaneously with the first active contact patterns ACP1 to the fourth active contact pattern ACP4. The gate contact patterns GCP may include the same metallic material as that of the first active contact patterns ACP1 to the fourth active contact pattern ACP4. The gate contact patterns GCP may have their top surfaces substantially coplanar with those of the first active contact patterns ACP1 to the fourth active contact pattern ACP4.

For example, the gate contact patterns GCP may overlap one or more first active pattern 101a or one or more second active pattern 101b that correspond to the gate contact patterns GCP. The gate contact patterns GCP may be spaced apart from each other across at least one gate structure GS.

A second interlayer dielectric layer 141 may be disposed on the first interlayer dielectric layer 135. The second interlayer dielectric layer 141 may cover the top surfaces of the first active contact patterns ACP1 to the fourth active contact pattern ACP4 and the top surfaces of the gate contact patterns GCP. An etch stop layer (not shown) may be disposed between the second interlayer dielectric layer 141 and the first interlayer dielectric layer 135. The etch stop layer may include a dielectric material having an etch selectivity with respect to the first interlayer dielectric layer 135 and the second interlayer dielectric layer 141.

First via pattern VP1 and second via pattern VP2 may be disposed in the second interlayer dielectric layer 141. The first via pattern VP1 may be coupled to the second active contact pattern ACP2, and the second via pattern VP2 may be coupled to the fourth active contact pattern ACP4. The first via pattern VP1 and the second via pattern VP2 may be disposed on the second device isolation layer 105 between the first active region NR and the second active region PR. The first via pattern VP1 and the second via pattern VP2 may include one or more of metal (e.g., tungsten, titanium, tantalum, cobalt, and copper) and conductive metal nitride (e.g., titanium nitride, tantalum nitride, and tungsten nitride).

Each of the first via pattern VP1 and the second via pattern VP2 may be disposed between a pair of gate structures GS. The first via pattern VP1 and the second via pattern VP2 may be spaced apart in the first direction D1 from each other across one of the gate structures GS. The first via pattern VP1 and the second via pattern VP2 may overlap the second device isolation layer 105 by being directly or indirectly over the second device isolation layer 105 in the third direction D3.

For example, each of the first via pattern VP1 and the second via pattern VP2 may have a bar shape whose major axis extends in the second direction D2. Each of the first via pattern VP1 and the second via pattern VP2 may have a length less a distance between the first active patterns 101a and the second active patterns 101b that are adjacent to each other in the second direction D2. A portion of the first via pattern VP1 may be in contact with a portion of one of the first active contact patterns ACP1, and a portion of the second via pattern VP2 may be in contact with a portion of the second active contact pattern ACP2.

A third interlayer dielectric layer 143 may be disposed on the second interlayer dielectric layer 141. The third interlayer dielectric layer 143 may cover top surfaces of the first via pattern VP1 and the second via pattern VP2.

An etch stop layer (not shown) may be disposed between the third interlayer dielectric layer 143 and the second interlayer dielectric layer 141. The etch stop layer may include a dielectric material having an etch selectivity with respect to the second interlayer dielectric layer 141 and the third interlayer dielectric layer 143.

A connection pattern CP may be disposed in the third interlayer dielectric layer 143 and may be coupled to the first via pattern VP1 and the second via pattern VP2. As shown in at least FIG. 2A, FIG. 2B and FIG. 2C, the connection pattern CP is on (over) the second device isolation layer 105 in the third direction D3. The connection pattern is between the first active region NR and the second active region PR in the second dimension D2. Also, as shown in FIG. 2A and FIG. 2B, the connection pattern CP may run across (over) one of the gate structures GS in the third direction D3. For example, the connection pattern CP may have a bar or linear shape that extends in the first direction D1 on the second device isolation layer 105. For example, the connection pattern CP may have a primary dimension in the first direction D1 that is larger than any dimension in planes perpendicular to the first direction D1. When viewed in plan, the connection pattern CP may be spaced apart from the second active contact pattern ACP2 and the fourth active contact pattern ACP4. The connection pattern CP may be in contact with a portion of the first via pattern VP1 and may also be in contact with a portion of the second via pattern VP2. As a result, the connection pattern CP connects the second active pattern ACP2 via the first via pattern VP1 with/to the fourth active pattern ACP4 via the second via pattern VP2. The first interlayer dielectric layer 135, the second interlayer dielectric layer 141, and the third interlayer dielectric layer 143 may vertically separate the connection pattern CP from the gate structure GS. As used herein, the term "vertically" may refer to the third direction D3 that is perpendicular to a plane formed by the first direction D1 and the second direction D2. The connection pattern CP may include one or more of metal (e.g., tungsten, titanium, tantalum, cobalt, and copper) and conductive metal nitride (e.g., titanium nitride, tantalum nitride, and tungsten nitride).

According to some embodiments, the first source/drain pattern 130a of the first active region NR may be electrically connected to the second source/drain pattern 130b of the second active region PR through the first via pattern VP1 and the second via pattern VP2 and the connection pattern CP that extends only in the first direction D1, without a connection pattern extending in the second direction D2. In such cases, an electrical connection path may be reduced between the first source/drain pattern 130a and the second source/drain pattern 130b.

Because the first source/drain pattern 130a and the second source/drain pattern 130b are electrically connected to each other through the second active contact pattern ACP2 and the fourth active contact pattern ACP4, the first via pattern VP1 and the second via pattern VP2, and the connection pattern CP, metal patterns may decrease in resistance thereof and capacitance therebetween.

Figure 3:
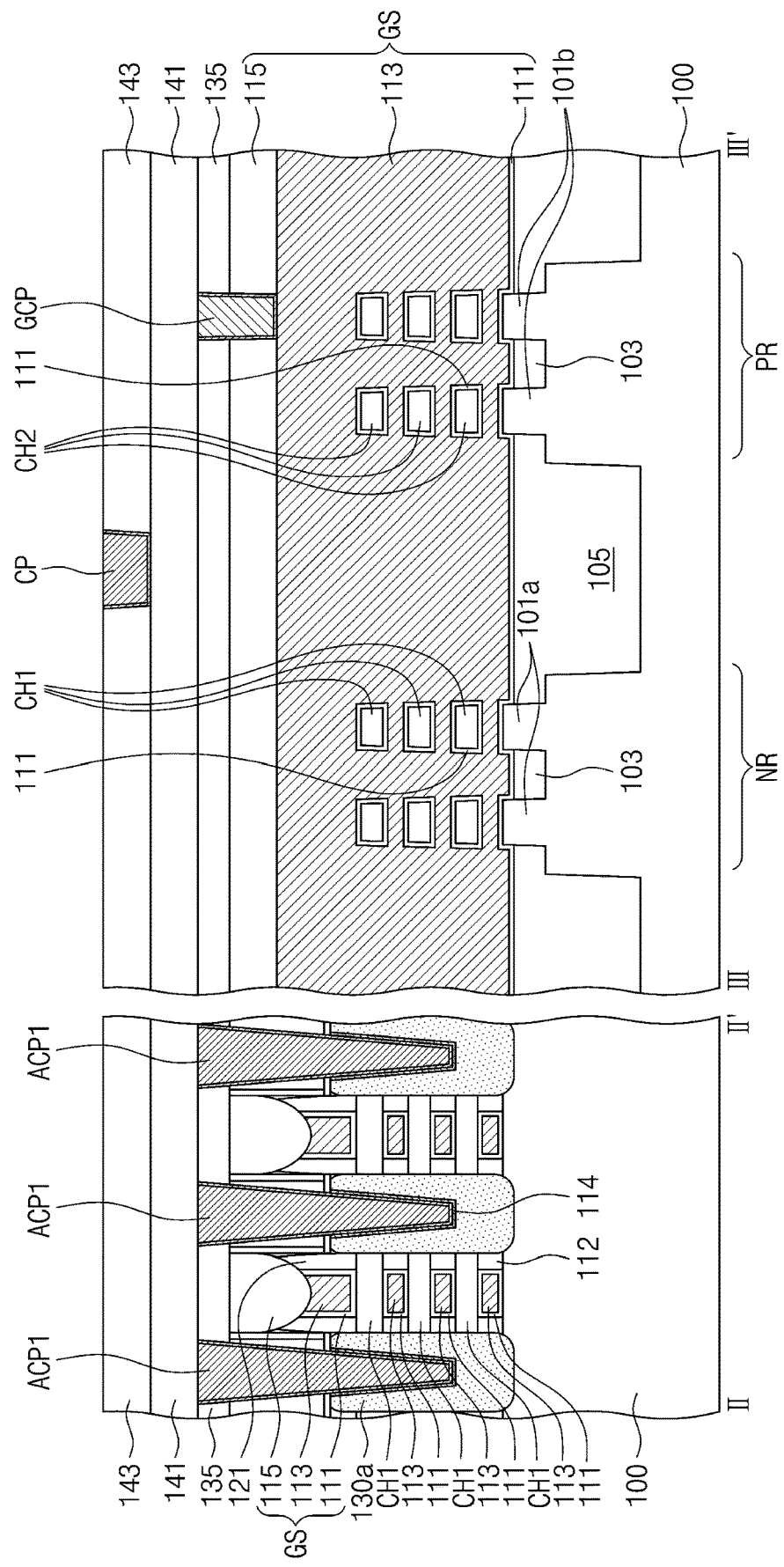
FIG. 3 illustrates a cross-sectional view taken along lines II-II' and of FIG. 1, showing a semiconductor device according to some example embodiments of the present disclosure.

FIG. 3 illustrates a cross-sectional view taken along lines II-II' and of FIG. 1, showing a semiconductor device according to some example embodiments of the present disclosure. The same technical features as those of the embodiments discussed above with reference to FIGS. 1, 2A, 2B, and 2C may be omitted in the interest of brevity of description. A semiconductor device shown in FIG. 3 may be a multi-bridge channel field effect transistor (MBCFET). The MBCFET may include, for example, multiple thin rectangular nano-sheet channels and a gate electrode that surrounds the channels up-and-down and right-and-left. The thin nano-sheets that form the nano-sheet channels may be vertically stacked (i.e., in the third direction D3).

For example, referring to FIG. 3, each of the first active patterns 101a may be provided thereon with first channel patterns CH1 that are vertically (i.e., in the third direction D3) stacked and spaced apart from each other. The first channel patterns CH1 stacked on the first active patterns 101a may vertically overlap each other.

Each of the second active patterns 101b may be provided thereon with second channel patterns CH2 that are vertically (i.e., in the third direction D3) stacked and spaced apart from each other. The second channel patterns CH2 stacked on the second active patterns 101b may vertically overlap each other. The first channel pattern CH1 and the second channel pattern CH2 may include one or more of silicon (Si), germanium (Ge), and silicon-germanium (SiGe).

The first source/drain patterns 130a may be provided on each of the first active patterns 101a. The stacked first channel patterns CH1 may be interposed between a pair of first source/drain patterns 130a that neighbor one another. The stacked first channel patterns CH1 may connect the pair of first source/drain patterns 130a to each other.

The second source/drain patterns 130b may be provided on each of the second active patterns 101b. The stacked second channel patterns CH2 may be interposed between a pair of second source/drain patterns 130b that neighbor one another. The stacked second channel patterns CH2 may connect the pair of second source/drain patterns 130b to each other.

As discussed above, each of the gate structures GS may include the gate dielectric layer 111, the gate conductive pattern 113, and the capping dielectric pattern 115, and the gate spacers 121 may be disposed on opposite sidewalls of each of the gate structures GS. The capping dielectric pattern 115 may have a rounded bottom surface, and the rounded surface may be in contact with the top surface of the gate conductive pattern 113. The rounded surface of the capping dielectric pattern 115 may be in contact with sidewalls of the gate spacers 121.

On each of the gate structures GS, the gate conductive pattern 113 may surround the first channel patterns CH1 and the second channel patterns CH2. For example, the gate conductive pattern 113 may surround top and bottom surfaces and opposite sidewalls of each of the first channel pattern CH1 and the second channel pattern CH2. In this sense, transistors provided on the first active region NR and the second active region PR may be gate-all-around type field effect transistors.

The gate dielectric layer 111 may be provided between the gate conductive pattern 113 and each of the first channel pattern CH1 and the second channel pattern CH2. The gate dielectric layer 111 may surround a corresponding one of the first channel pattern CH1 and the second channel pattern CH2.

Inner spacers 112 may be disposed below the gate spacers 121 and on sidewalls of the gate structure GS. When viewed vertically (i.e., in the third direction D3), the inner spacers 112 may be locally disposed between neighboring first channel patterns CH1 and between the first active patterns 101a and a lowermost one of the first channel patterns CH1. When viewed horizontally, ones of the inner spacers 112 may be locally disposed between the first source/drain patterns 130a and opposite sidewalls of the gate structure GS. The inner spacers 112 may contact the gate dielectric layer 111 and may include a dielectric material.

The first active contact patterns ACP1 and the second active contact pattern ACP2 may penetrate the first interlayer dielectric layer 135 and the gap-fill dielectric layer 133 and may be coupled to the first source/drain patterns 130a. The first active contact patterns ACP1 and the second active contact pattern ACP2 may be disposed in portions of the first source/drain patterns 130a, and a metal silicide layer 114 may be formed between the first source/drain patterns 130a and the first active contact patterns ACP1 and the second active contact pattern ACP2.

Figure 4A:
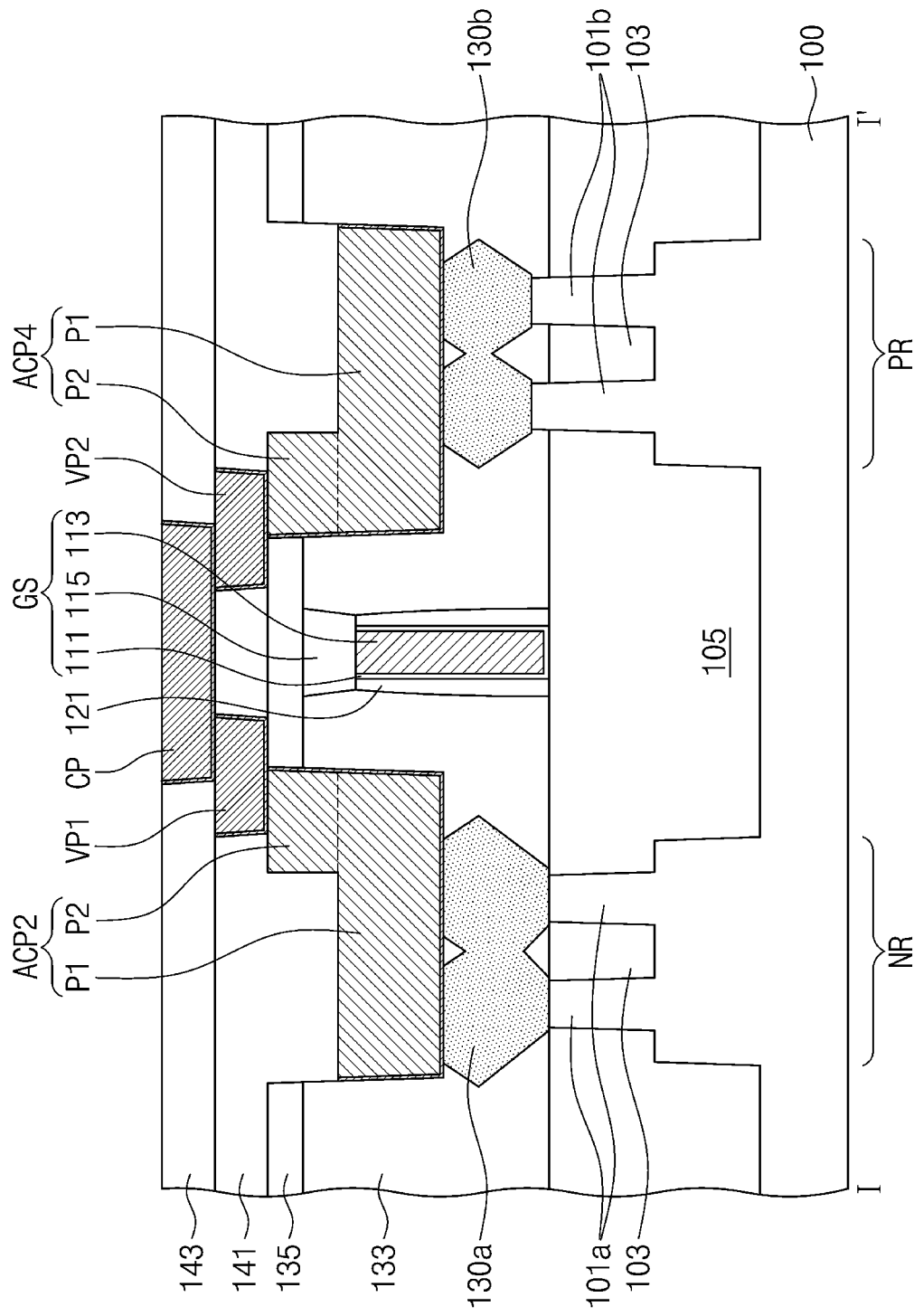
FIG. 4A illustrates a cross-sectional view taken along line I-I' of FIG. 1, showing a semiconductor device according to some example embodiments of the present disclosure.
Figure 4B:
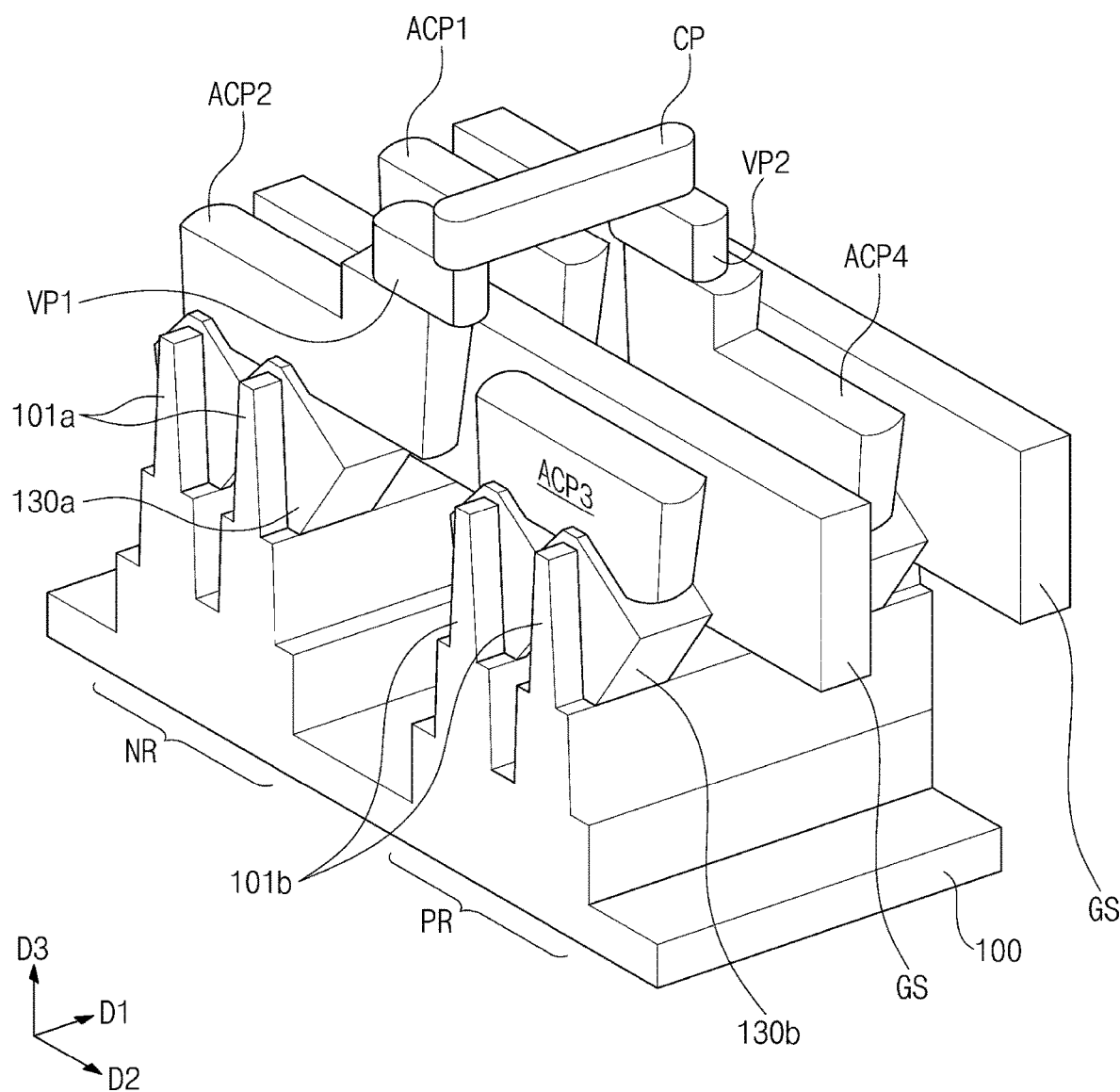
FIG. 4B illustrates a perspective view showing the semiconductor device depicted in FIGS. 1 and 4A.

FIG. 4A illustrates a cross-sectional view taken along line I-I' of FIG. 1, showing a semiconductor device according to some example embodiments of the present disclosure. FIG. 4B illustrates a perspective view showing the semiconductor device depicted in FIGS. 1 and 4A. The same technical features as those of the embodiments discussed above with reference to FIGS. 1, 2A, 2B, and 2C may be omitted in the interest of brevity of description.

Referring to FIGS. 1, 4A, and 4B, the second active contact pattern ACP2 may include a first segment P1 that contacts the first source/drain pattern 130a and a second segment P2 that vertically (i.e., in the third direction) protrudes from a portion of the first segment P1. The first segment P1 may have a top surface at a lower level than that of the top surface of the gate structure GS, and the second segment P2 may have a top surface at a higher level than that of the top surface of the gate structure GS.

The first segment P1 of the second active contact pattern ACP2 may extend in the second direction D2 and may run across the first active patterns 101a. For example, the first segment P1 may have a primary dimension in the second direction D2 that is larger than any dimension in planes perpendicular to the second direction D2. The first segment P1 of the second active contact pattern ACP2 may have the second length L2 in the second direction D2, and the first active contact patterns ACP1 may each have the first length L1 in the second direction D2 less than the second length L2. The top surfaces of the first active contact patterns ACP1 may be located at substantially the same level as that of the top surface of the first segment P1 of the second active contact pattern ACP2.

The fourth active contact pattern ACP4 may include a first segment P1 that contacts the second source/drain pattern 130b and a second segment P2 that vertically (i.e., in the third direction) protrudes from a portion of the first segment P1. The fourth active contact pattern ACP4 may have substantially the same structure as that of the second active contact pattern ACP2.

The first via pattern VP1 may contact the second segment P2 of the second active contact pattern ACP2, and the second via pattern VP2 may contact the second segment P2 of the fourth active contact pattern ACP4. The first via pattern VP1 and the second via pattern VP2 may be electrically connected to each other through the connection pattern CP that runs across the gate structures GS.

Figure 5A:
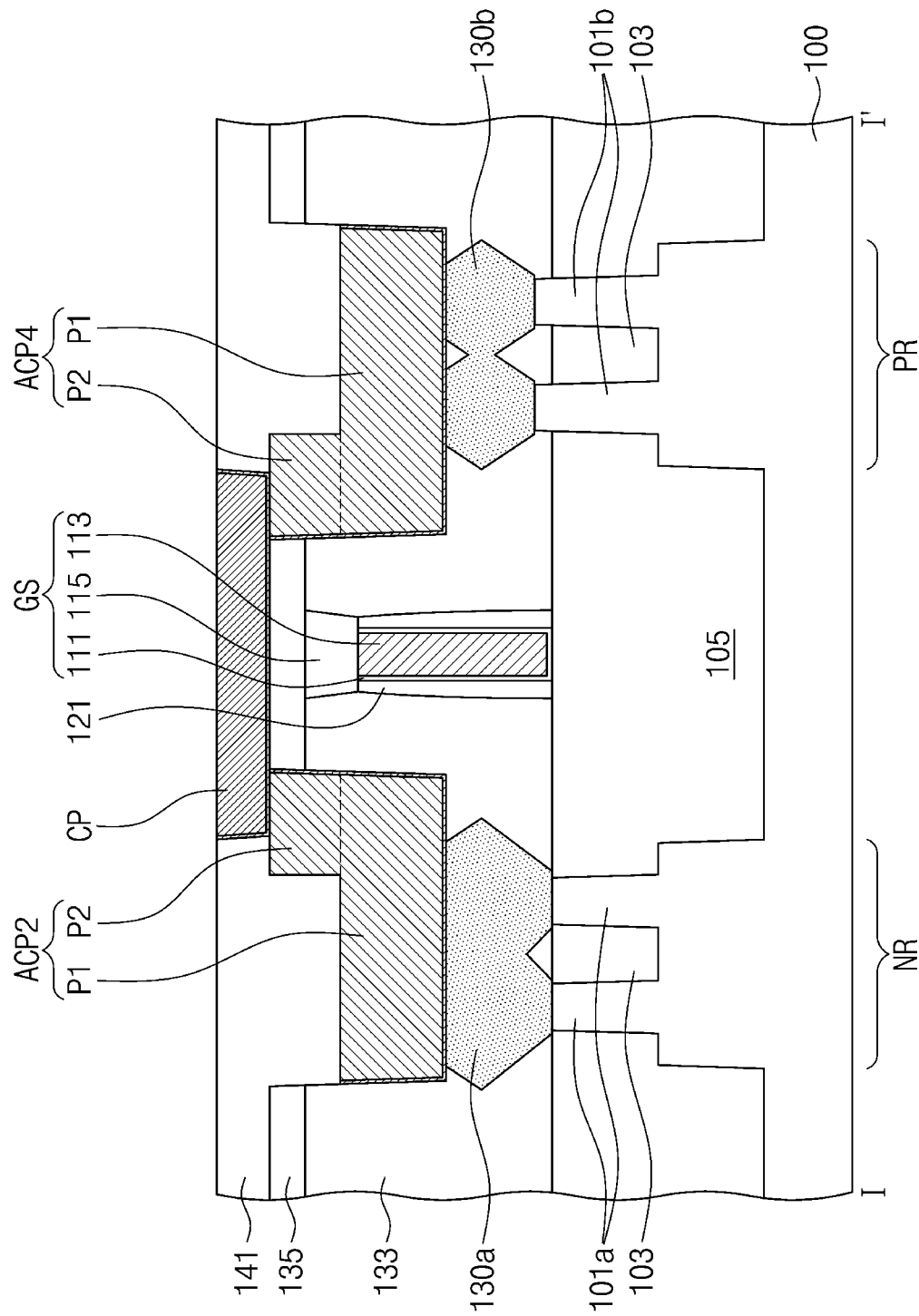
FIG. 5A illustrates a cross-sectional view taken along line I-I' of FIG. 1, showing a semiconductor device according to some example embodiments of the present disclosure.
Figure 5B:
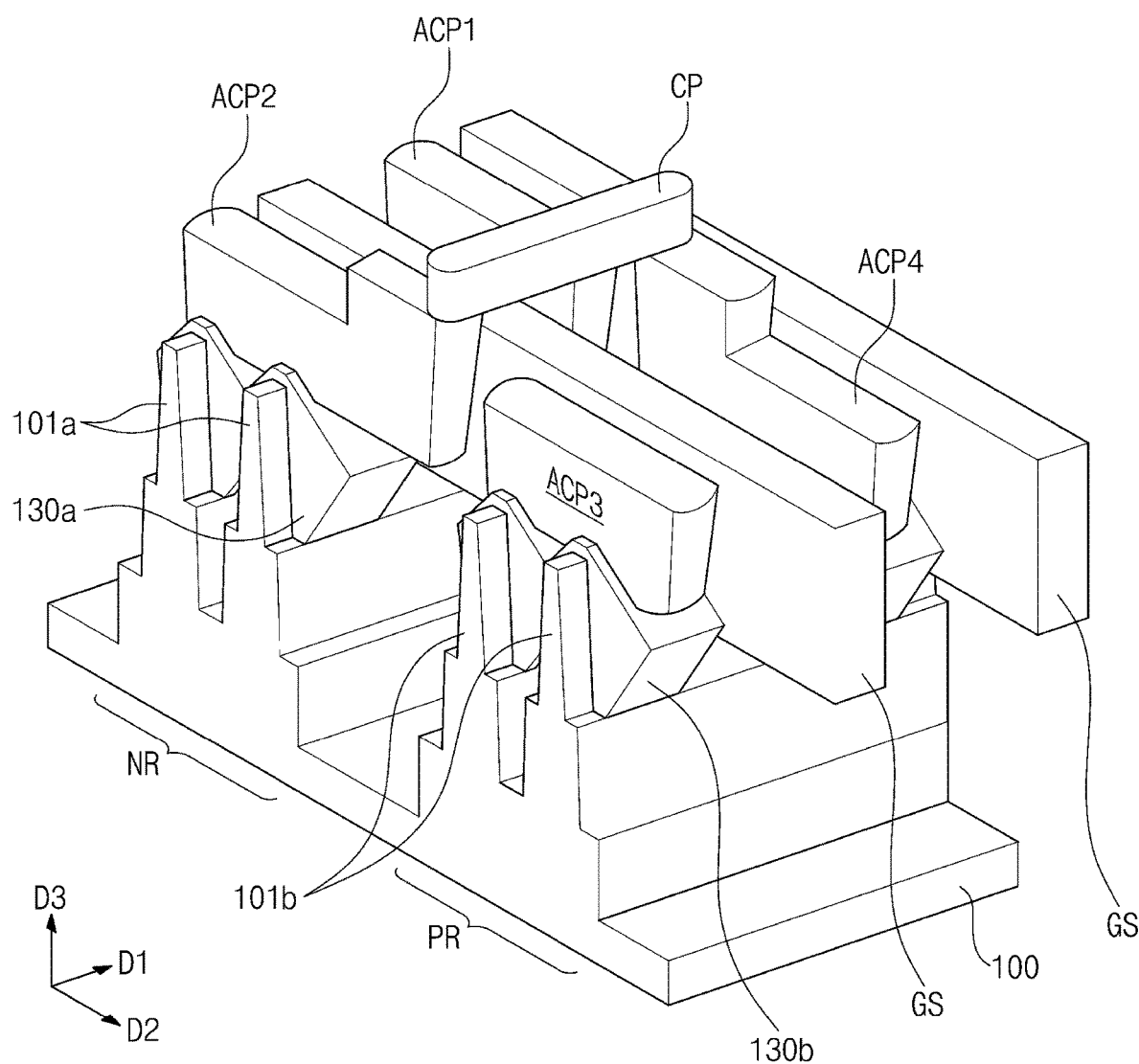
FIG. 5B illustrates a perspective view showing the semiconductor device depicted in FIGS. 1 and 5A.

FIG. 5A illustrates a cross-sectional view taken along line I-I' of FIG. 1, showing a semiconductor device according to some example embodiments of the present disclosure. FIG. 5B illustrates a perspective view showing the semiconductor device depicted in FIGS. 1 and 5A. The same technical features as those of the embodiments discussed above with reference to FIGS. 4A and 4B are omitted in the interest of brevity of description, and differences are discussed below.

Referring to FIGS. 5A and 5B, each of the second active contact pattern ACP2 and the fourth active contact pattern ACP4 may include a first segment P1 that extends in the second direction D2 and a second segment P2 that vertically (i.e., in the third direction) protrudes from a portion of the first segment P1. For example, each of the second active contact pattern ACP2 and the fourth active contact pattern ACP4 may have a primary dimension in the second direction D2 that is larger than any dimension in planes perpendicular to the second direction D2

The connection pattern CP running across the gate structure GS may directly contact the second segments P2 of the second active contact pattern ACP2 and the fourth active contact pattern ACP4, without the first via pattern or the second via pattern.

Figure 6A:
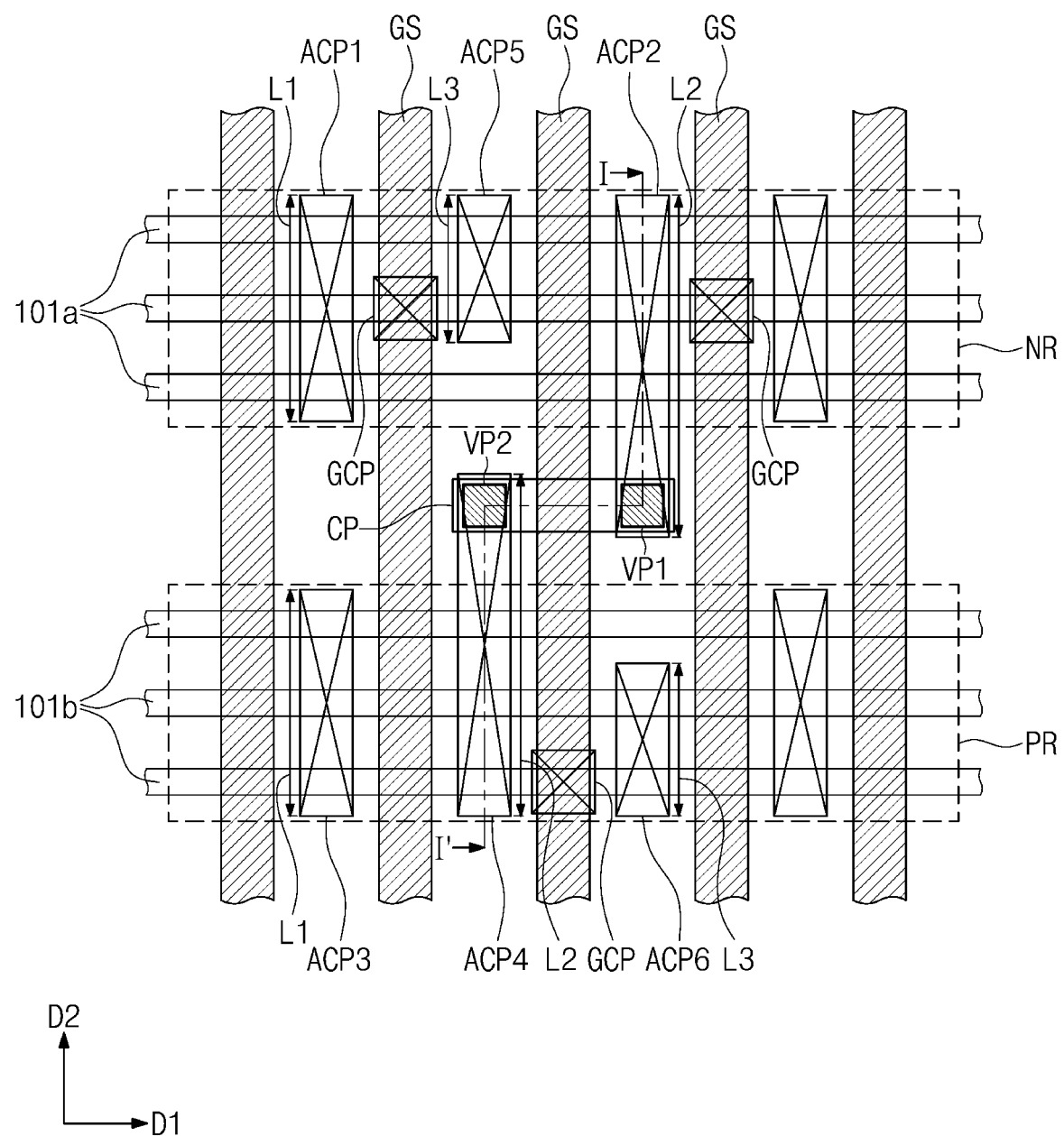
FIG. 6A illustrates a plan view showing a semiconductor device according to some example embodiments of the present disclosure.
Figure 6B:
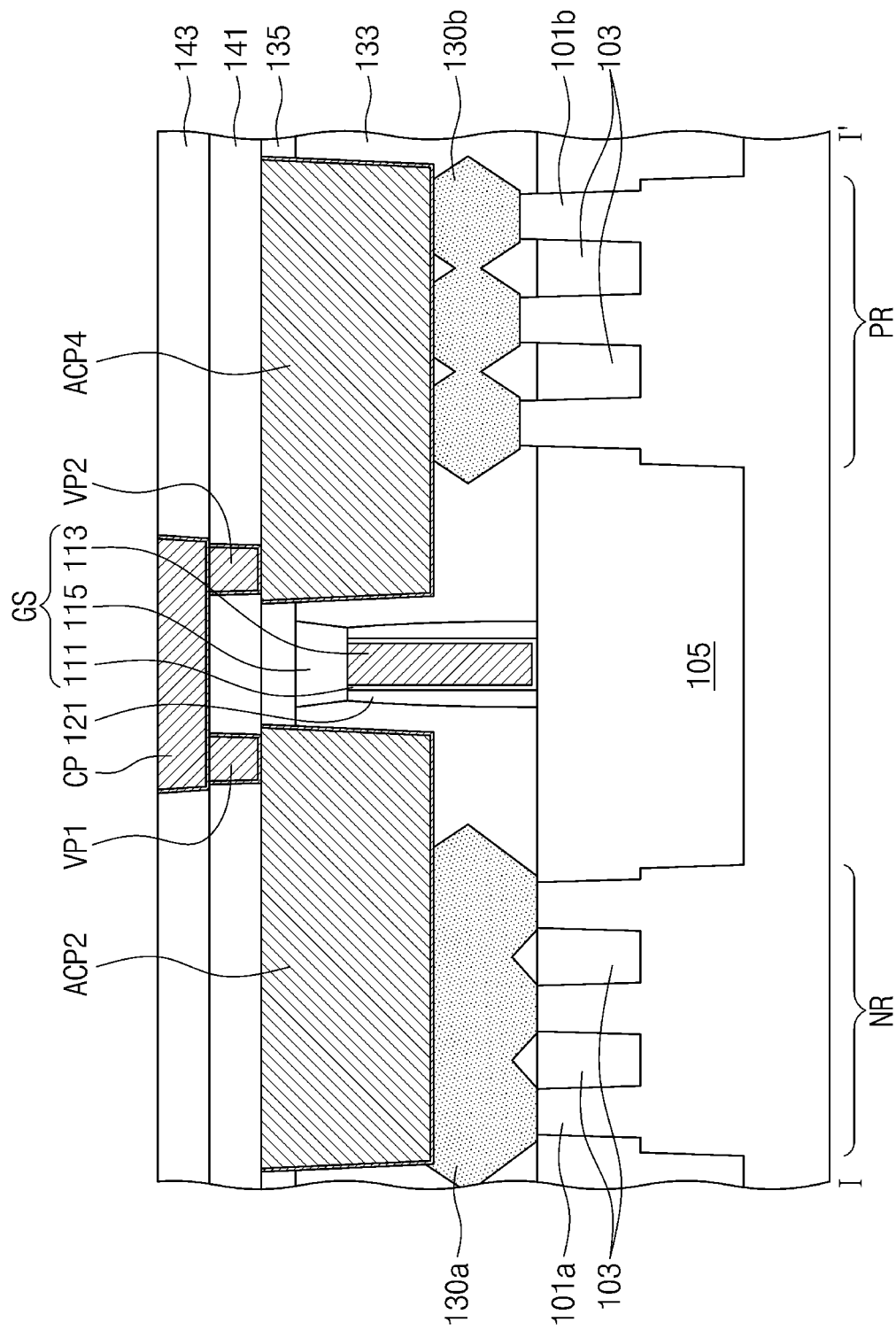
FIG. 6B illustrates a cross-sectional view taken along line II-II' of FIG. 6A, showing a semiconductor device according to some example embodiments of the present disclosure.

FIG. 6A illustrates a plan view showing a semiconductor device according to some example embodiments of the present disclosure. FIG. 6B illustrates a cross-sectional view taken along line II-II' of FIG. 6A, showing a semiconductor device according to some example embodiments of the present disclosure.

Referring to FIGS. 6A and 6B, the first active region NR may include a fifth active contact pattern ACP5 spaced apart in the second direction D2 from the fourth active contact pattern ACP4. The second active region PR may include a sixth active contact pattern ACP6 spaced apart in the second direction D2 from the second active contact pattern ACP2. The fifth active contact pattern ACP5 may run across one of the first active patterns 101a on the first active region NR, and the sixth active contact pattern ACP6 may run across one of the second active patterns 101b on the second active region PR. The fifth active contact pattern ACP5 and the sixth active contact pattern ACP6 may be formed simultaneously with the first active contact patterns ACP1 to the fourth active contact pattern ACP4. Each of the fifth active contact patterns ACP5 and sixth active contact patterns ACP6 may have a third length L3 less than the first length L1.

A portion of each of the second active contact pattern ACP2 and the fourth active contact pattern ACP4 may overlap the connection pattern CP on the second device isolation layer 105 by being directly or indirectly under the connection pattern CP and over the second device isolation layer 105 in the third direction D3.

The first via pattern VP1 may be positioned at an intersection between the second active contact pattern ACP2 and the connection pattern CP. For example, an entirety of the first via pattern VP1 may overlap the connection pattern CP and the second active contact pattern ACP2 by being directly or indirectly under the connection pattern CP and over the second device isolation layer 105 in the third direction D3. Likewise, the second via pattern VP2 may be positioned at an intersection between the fourth active contact patterns ACP4 and the connection pattern CP.

Figure 7A:
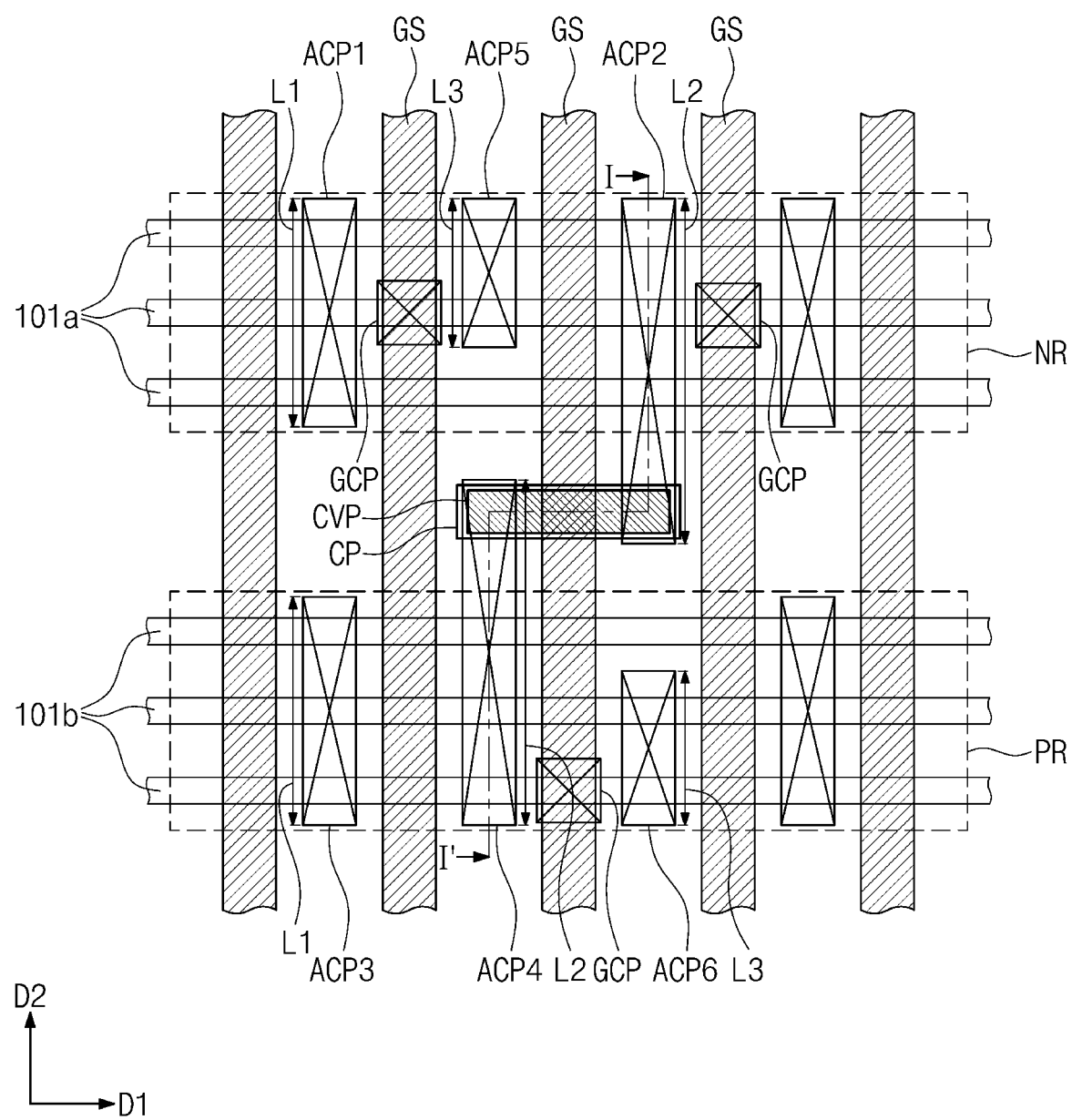
FIG. 7A illustrates a plan view showing a semiconductor device according to some example embodiments of the present disclosure.
Figure 7B:
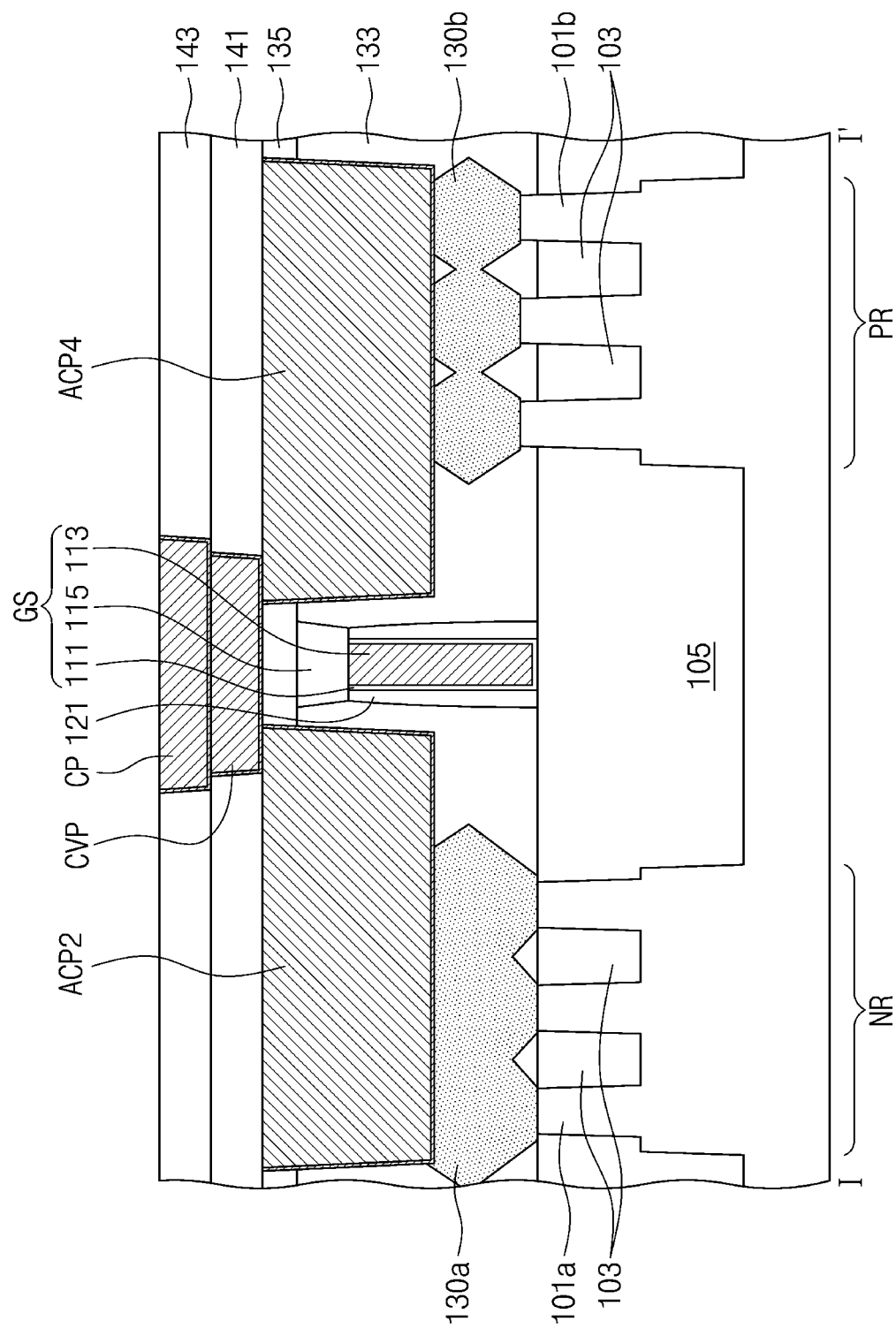
FIG. 7B illustrates a cross-sectional view taken along line I-I' of FIG. 7A, showing a semiconductor device according to some example embodiments of the present disclosure.

FIG. 7A illustrates a plan view showing a semiconductor device according to some example embodiments of the present disclosure. FIG. 7B illustrates a cross-sectional view taken along line I-I' of FIG. 7A, showing a semiconductor device according to some example embodiments of the present disclosure. The same technical features as those of the embodiments discussed above with reference to FIGS. 6A and 6B are omitted in the interest of brevity of description, and differences are discussed below.

Referring to FIGS. 7A and 7B, between the first active region NR and the second active region PR, a common via pattern CVP may be disposed to run across the gate structure GS. The common via pattern CVP may be coupled in common to the second active contact pattern ACP2 and the fourth active contact pattern ACP4. When viewed in cross-section, the common via pattern CVP may be disposed between the connection pattern CP and the second active contact pattern ACP2 and the fourth active contact pattern ACP4. The common via pattern CVP may extend in the first direction D1, and when viewed in plan, may overlap the connection pattern CP.

Figure 8A:
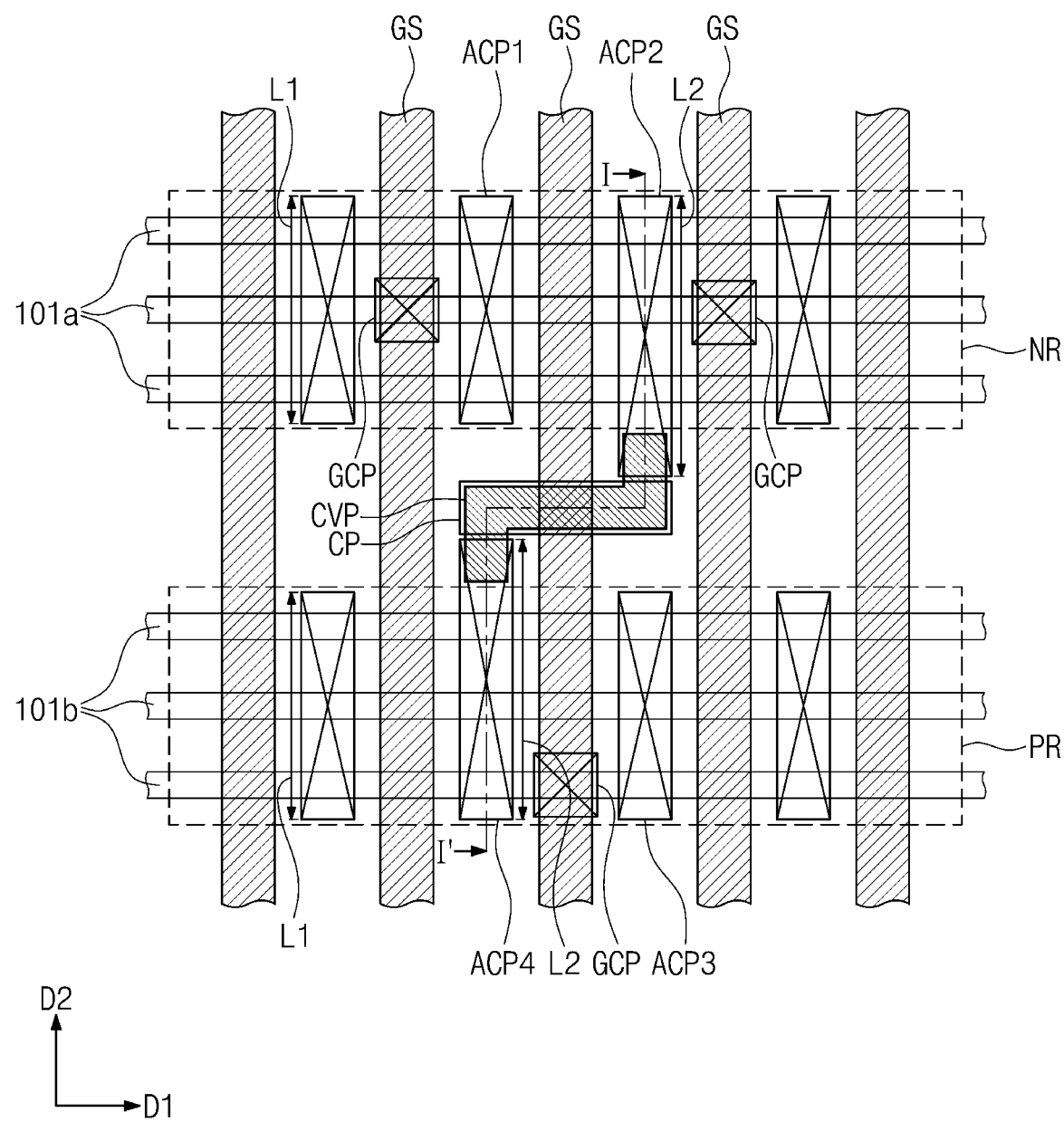
FIG. 8A illustrates a plan view showing a semiconductor device according to some example embodiments of the present disclosure.
Figure 8B:
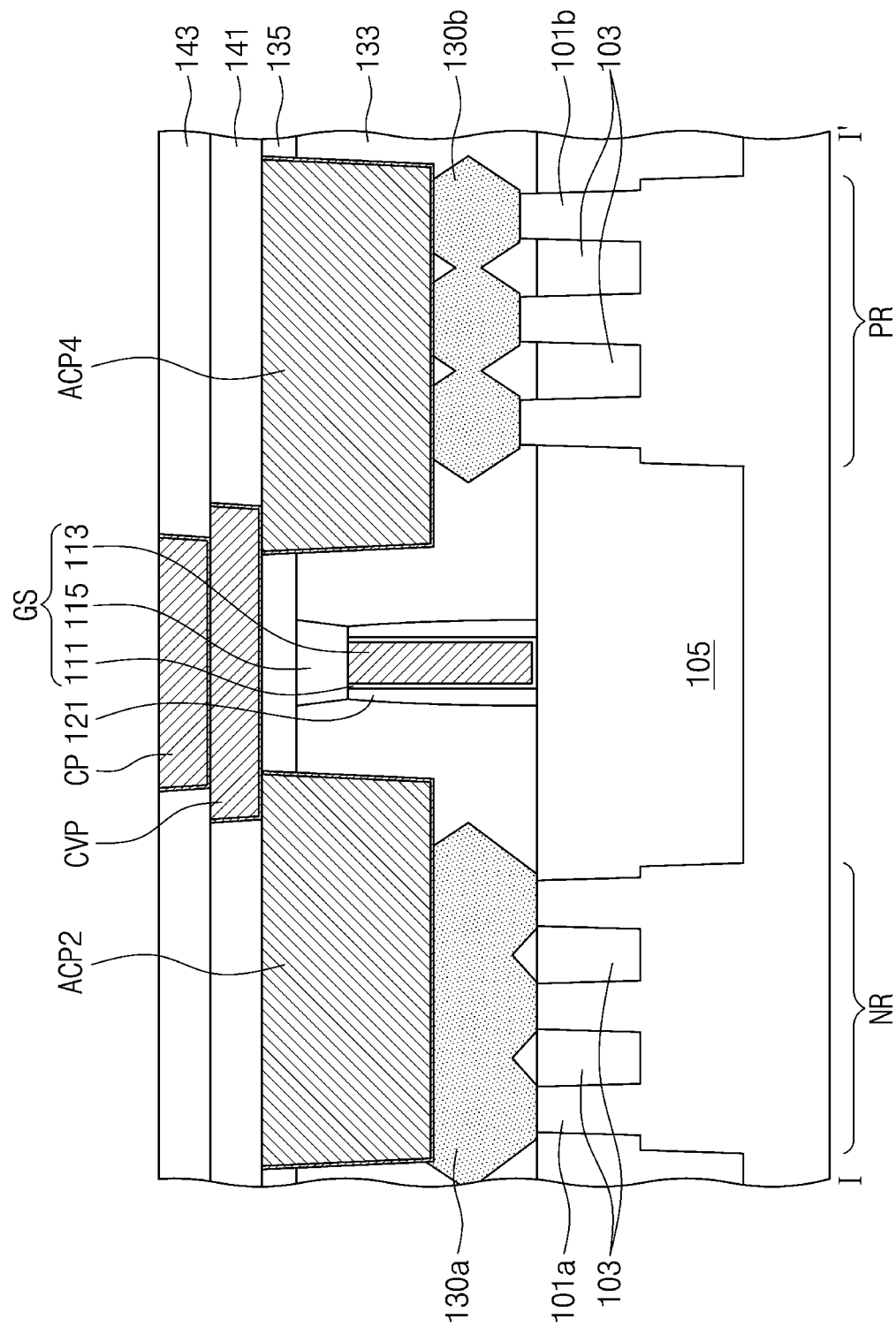
FIG. 8B illustrates a cross-sectional view taken along line I-I' of FIG. 8A, showing a semiconductor device according to some example embodiments of the present disclosure.

FIG. 8A illustrates a plan view showing a semiconductor device according to some example embodiments of the present disclosure. FIG. 8B illustrates a cross-sectional view taken along line I-I' of FIG. 8A, showing a semiconductor device according to some example embodiments of the present disclosure. The same technical features as those of the embodiments discussed above with reference to FIGS. 7A and 7B are omitted in the interest of brevity of description, and differences are discussed below.

Referring to FIGS. 8A and 8B, between the first active region NR and the second active region PR, the connection pattern CP may be disposed to run across the gate structure GS. When viewed in plan, the connection pattern CP may be spaced apart from the second active contact pattern ACP2 and the fourth active contact pattern ACP4.

The common via pattern CVP may be disposed on the second active contact pattern ACP2 and the fourth active contact pattern ACP4. The common via pattern CVP may include a line segment that extends in the first direction D1 parallel to the connection pattern CP. As shown in FIG. 8A, the common via pattern CVP also include protruding segments that protrude from opposite ends of the line segment in both the second direction D2 and a direction opposite to the second direction D2. The protruding segments of the common via pattern CVP may contact corresponding portions of the second active contact pattern ACP2 and the fourth active contact pattern ACP4. The connection pattern CP may contact the line segment of the common via pattern CVP.

Figure 9:
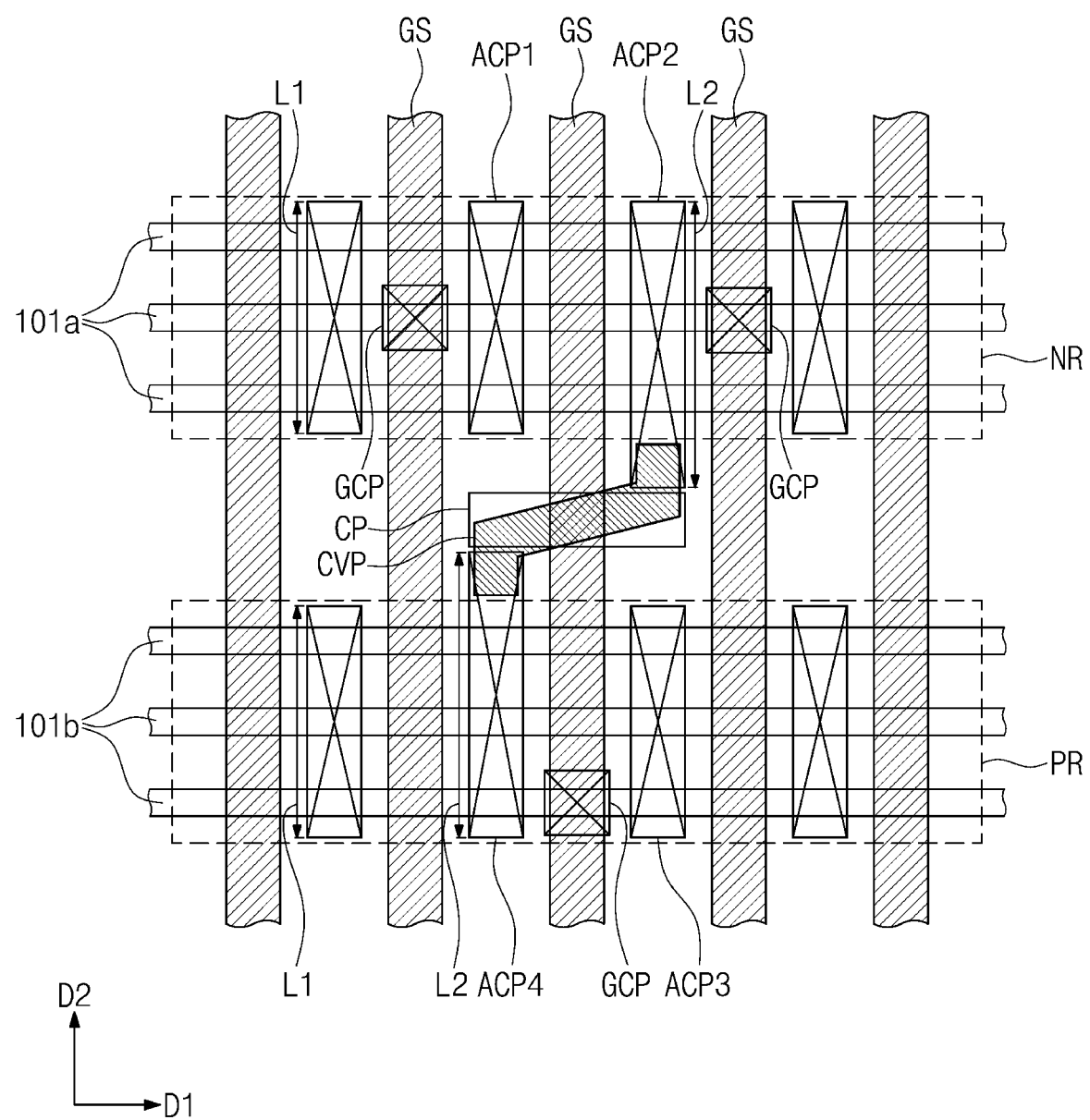
FIG. 9 illustrates a plan view showing a semiconductor device according to some example embodiments of the present disclosure.

FIG. 9 illustrates a plan view showing a semiconductor device according to some example embodiments of the present disclosure. The same technical features as those of the embodiments discussed above with reference to FIGS. 8A and 8B are omitted in the interest of brevity of description, and differences are discussed below Referring to FIG. 9, the common via pattern CVP may be configured such that the line segment running across the gate structure GS extends in an oblique direction to the first direction D1 and the second direction D2. The connection pattern CP may be disposed to run across the gate structure GS and the line segment of the common via pattern CVP and may contact a portion of the line segment of the common via pattern CVP.

Figure 10A:
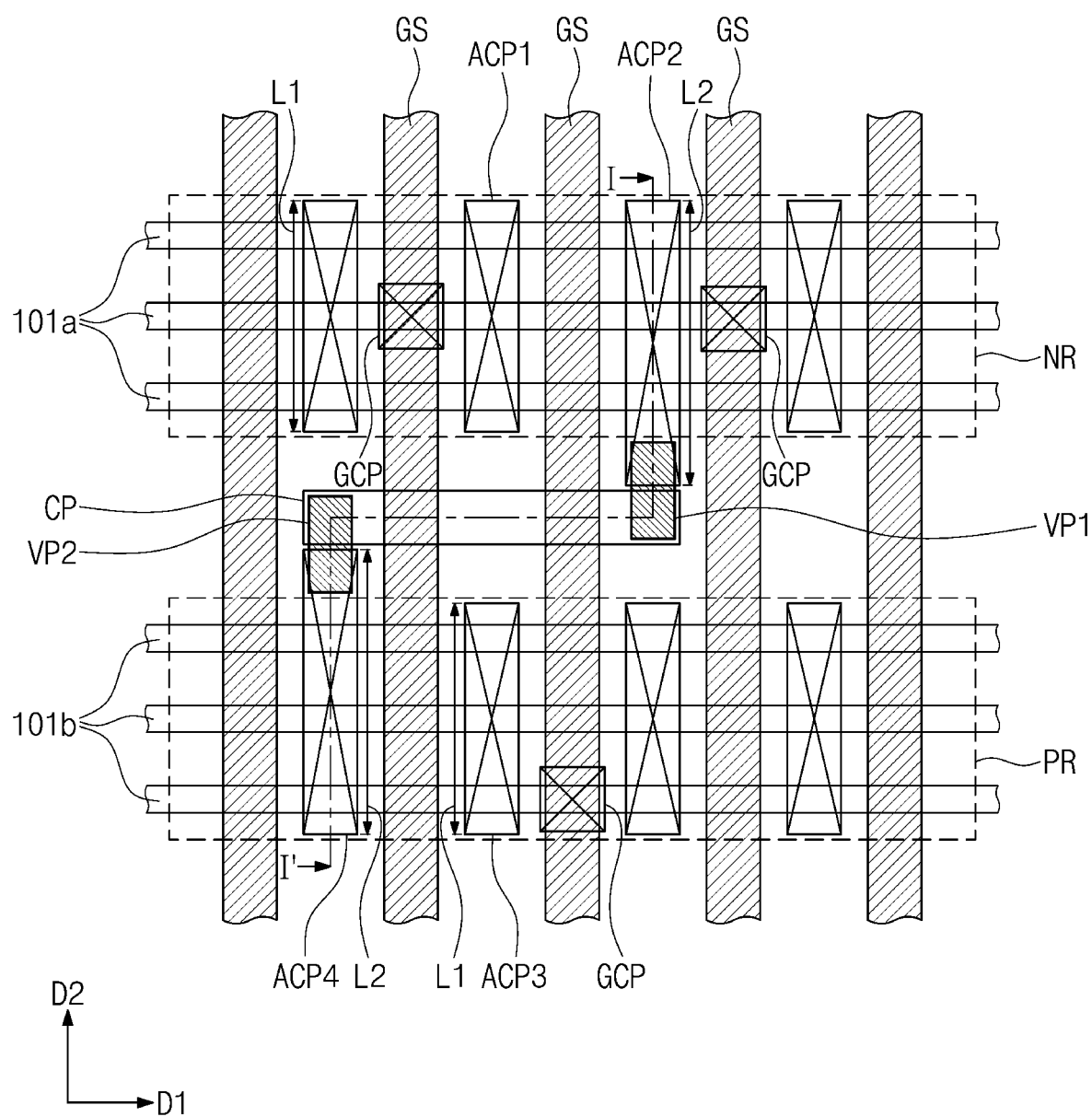
FIG. 10A illustrates a plan view showing a semiconductor device according to some example embodiments of the present disclosure.
Figure 10B:
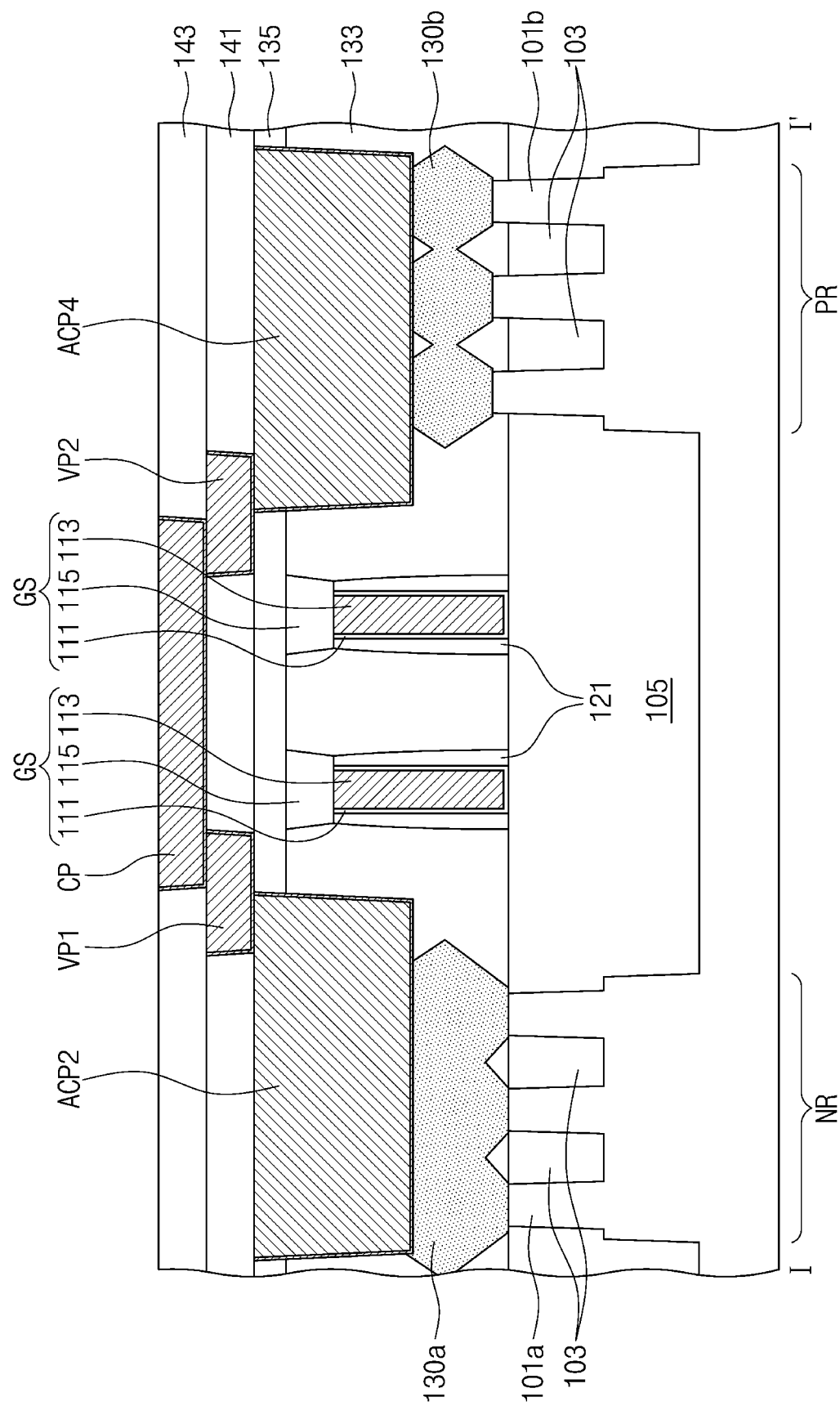
FIG. 10B illustrates a cross-sectional view taken along line I-I' of FIG. 10A, showing a semiconductor device according to some example embodiments of the present disclosure.

FIG. 10A illustrates a plan view showing a semiconductor device according to some example embodiments of the present disclosure. FIG. 10B illustrates a cross-sectional view taken along line I-I' of FIG. 10A, showing a semiconductor device according to some example embodiments of the present disclosure.

In the embodiments above, it is explained that the connection pattern CP is disposed to run across a single gate structure GS, but the inventive concepts of the present disclosure are not limited thereto. For example, as shown in FIGS. 10A and 10B, the connection pattern CP may run across at least two gate structures GS and may have electrical connection with the second active contact pattern ACP2 and the fourth active contact pattern ACP4.

Figure 11A:
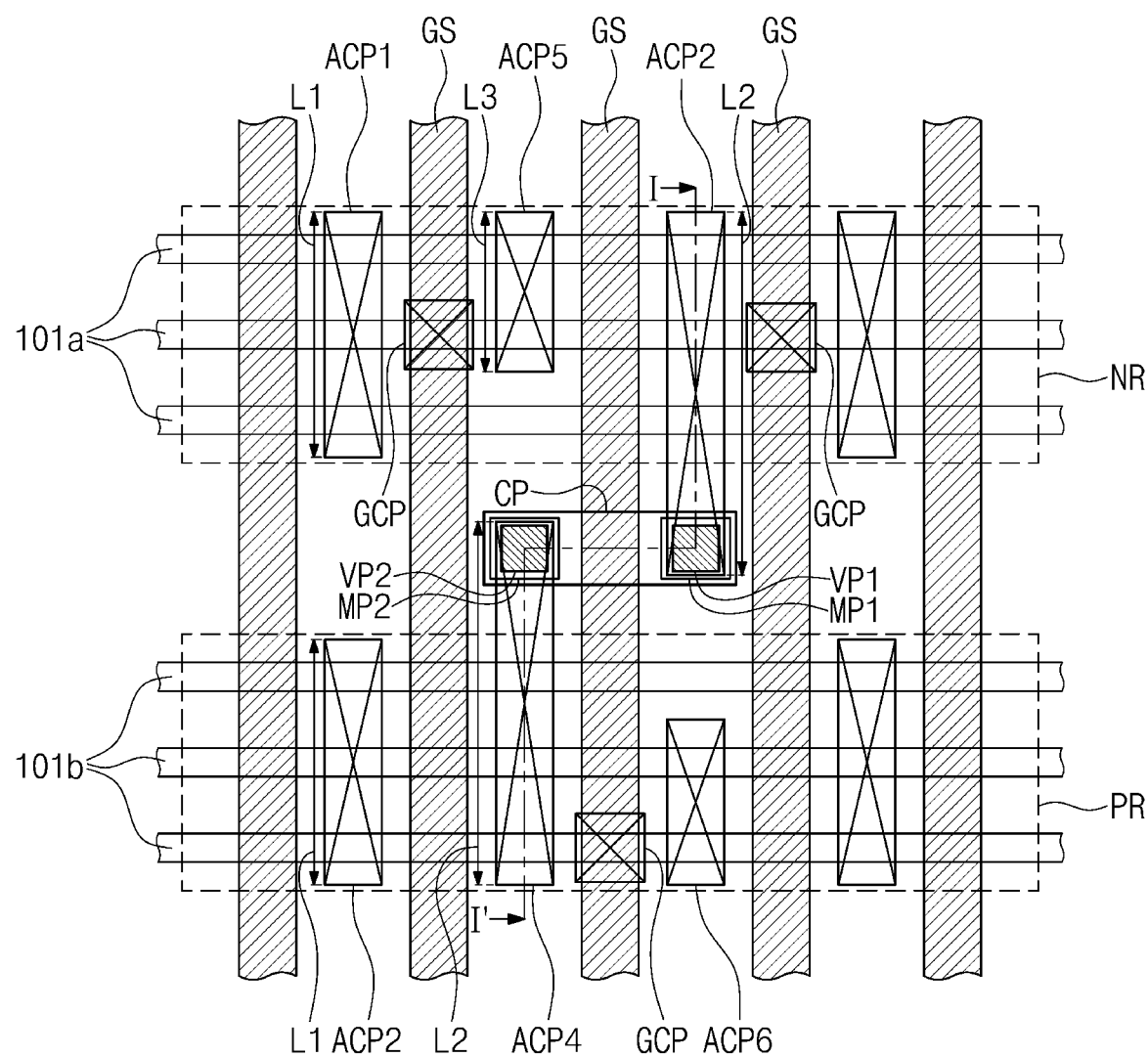
FIG. 11A illustrates a plan view showing a semiconductor device according to some example embodiments of the present disclosure.
Figure 11B:
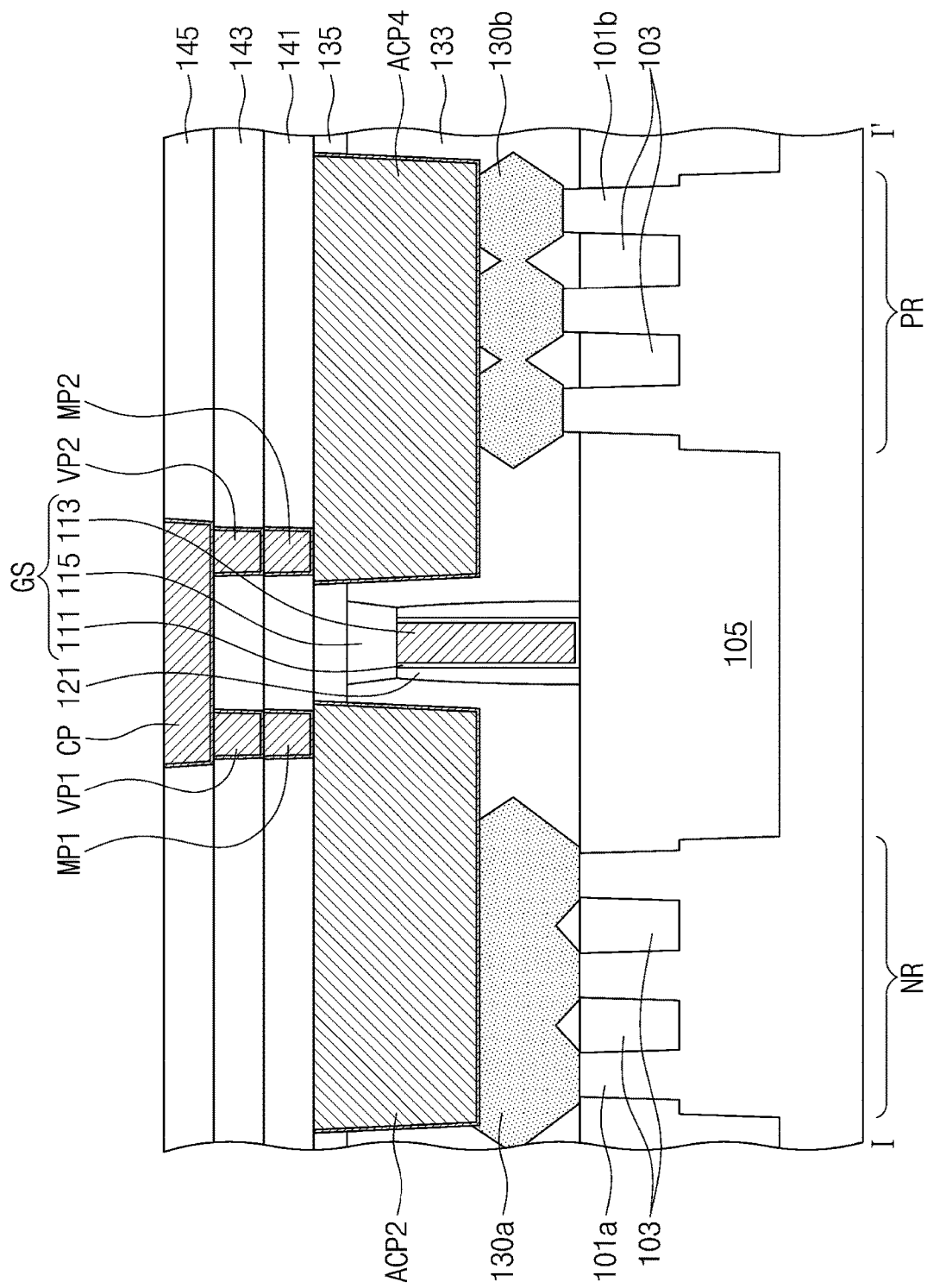
FIG. 11B illustrates a cross-sectional view taken along line I-I' of FIG. 11A, showing a semiconductor device according to some example embodiments of the present disclosure.

FIG. 11A illustrates a plan view showing a semiconductor device according to some example embodiments of the present disclosure. FIG. 11B illustrates a cross-sectional view taken along line I-I' of FIG. 11A, showing a semiconductor device according to some example embodiments of the present disclosure.

Referring to FIGS. 11A and 11B, a first middle conductive pattern MP1 may be disposed between the first via pattern VP1 and the second active contact patterns ACP2. A second middle conductive pattern MP2 may be disposed between the second via pattern VP2 and the fourth active contact pattern ACP4. The first middle conductive pattern MP1 and the second middle conductive pattern MP2 may penetrate the second interlayer dielectric layer 141. The first middle conductive pattern MP1 and the second middle conductive pattern MP2 may be respectively coupled to the second active contact pattern ACP2 and the fourth active contact pattern ACP4.

The first via pattern VP1 and the second via pattern VP2 may penetrate the third interlayer dielectric layer 143. The first via pattern VP1 and the second via pattern VP2 may be respectively coupled to the first middle conductive pattern MP1 and the second middle conductive pattern MP2.

The connection pattern CP may penetrate the fourth interlayer dielectric layer 145. The connection pattern CP may be coupled in common to the first via pattern VP1 and the second via pattern VP2.

The first via pattern VP1 and the first middle conductive pattern MP1 may be disposed at an intersection between the second active contact pattern ACP2 and the connection pattern CP. The second via pattern VP2 and the second middle conductive pattern MP2 may be disposed at an intersection between the fourth active contact pattern ACP4 and the connection pattern CP.

Figure 12A:
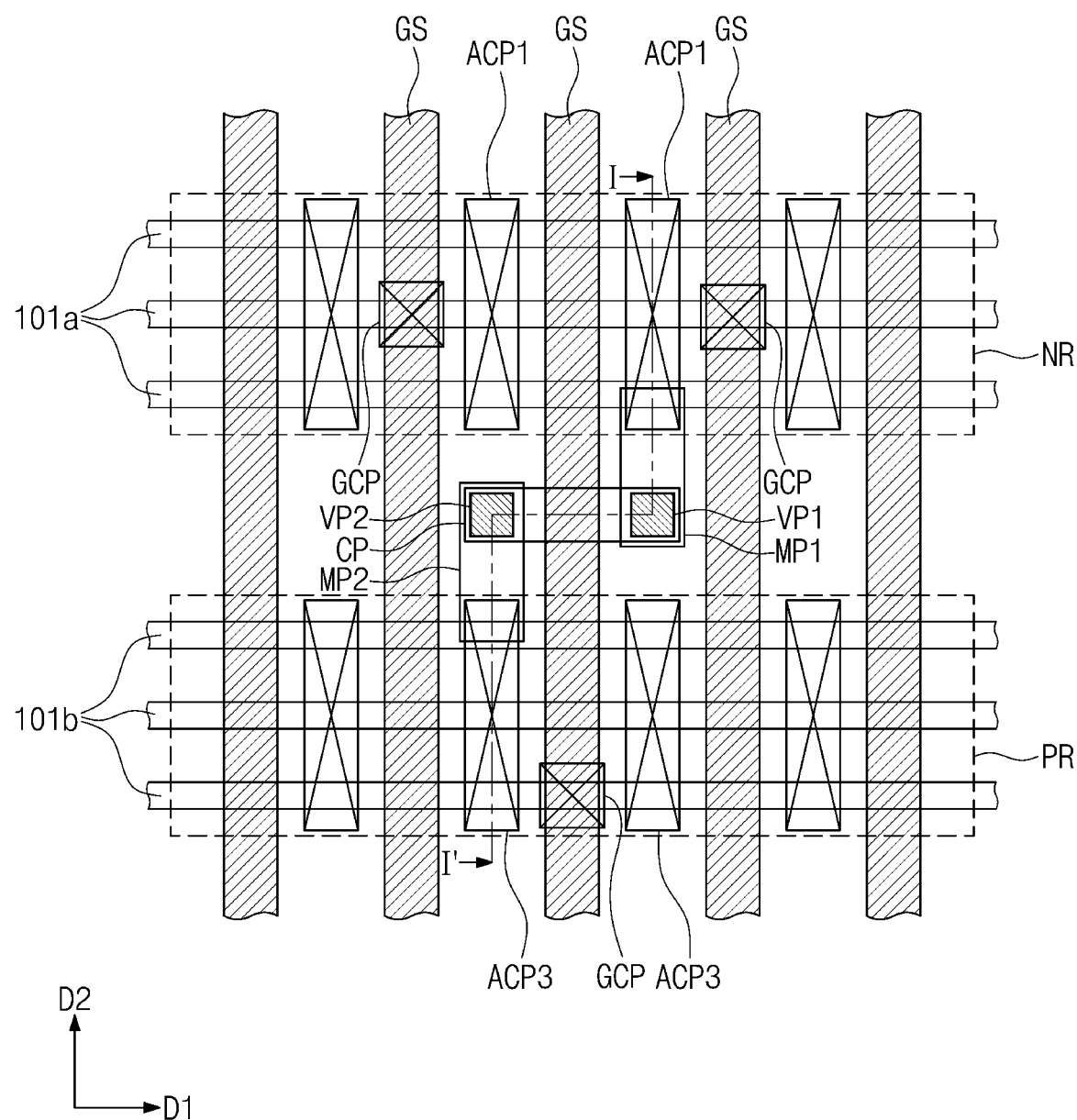
FIG. 12A illustrates a plan view showing a semiconductor device according to some example embodiments of the present disclosure.
Figure 12B:
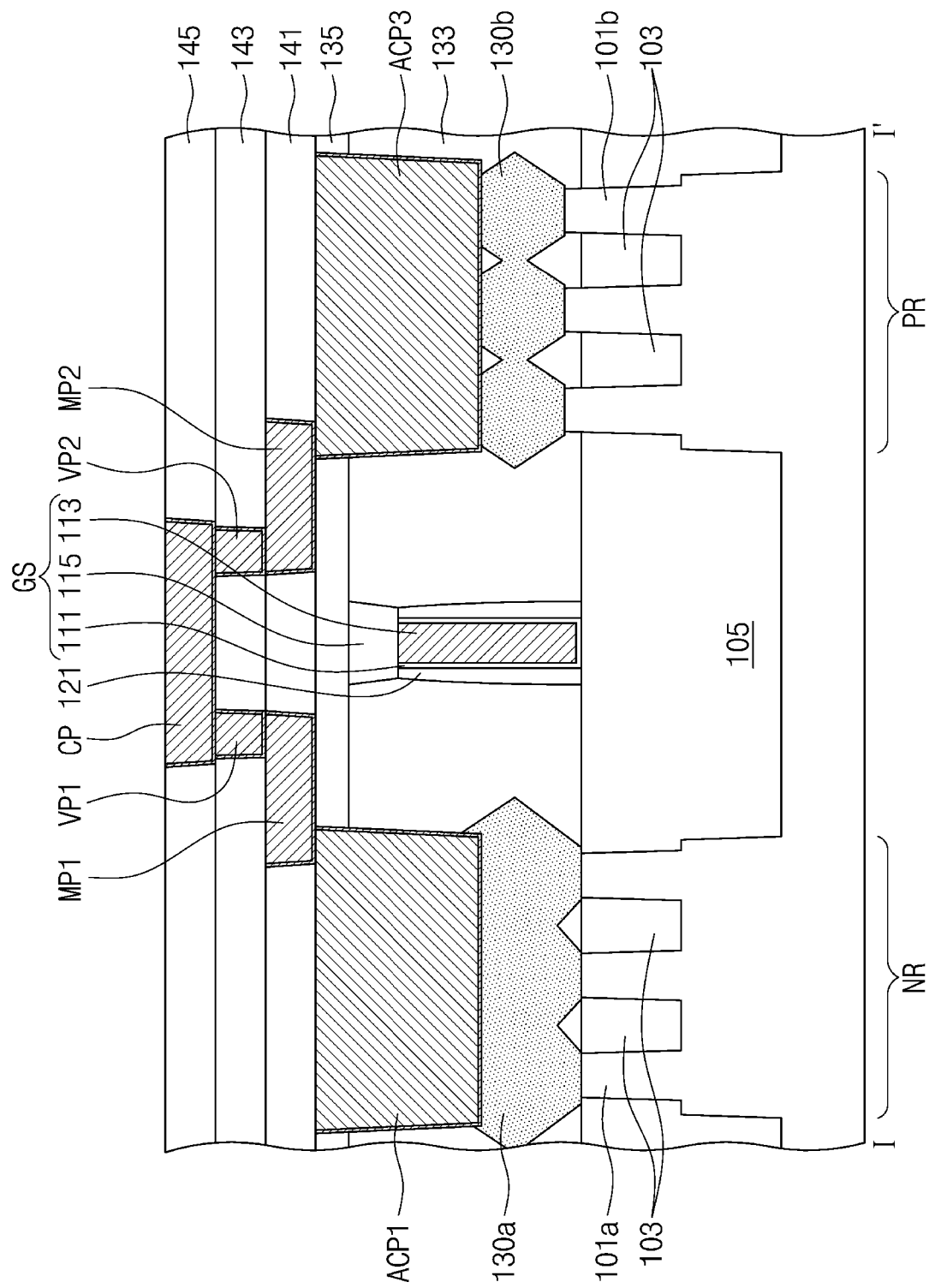
FIG. 12B illustrates a cross-sectional view taken along line I-I' of FIG. 12A, showing a semiconductor device according to some example embodiments of the present disclosure.

FIG. 12A illustrates a plan view showing a semiconductor device according to some example embodiments of the present disclosure. FIG. 12B illustrates a cross-sectional view taken along line I-I' of FIG. 12A, showing a semiconductor device according to some example embodiments of the present disclosure. The same technical features as those of the embodiments discussed above with reference to FIGS. 11A and 11B are omitted in the interest of brevity of description, and differences are discussed below Referring to FIGS. 12A and 12B, on the first active region NR, the first active contact patterns ACP1 having the same length may be disposed between the gate structures GS. On the second active region PR, the third active contact patterns ACP3 having the same length may be disposed between the gate structures GS.

Between the first active region NR and the second active region PR, the connection pattern CP may run across the gate structure GS. When viewed in plan, the connection pattern CP may be spaced apart from the first active contact patterns ACP1 and the third active contact patterns ACP3.

The first middle conductive pattern MP1 and the second middle conductive pattern MP2 may be disposed in the second interlayer dielectric layer 141 between the first active region NR and the second active region PR. The first middle conductive pattern MP1 may contact one of the first active contact patterns ACP1. The second middle conductive pattern MP2 may contact one of the third active contact patterns ACP3. The first middle conductive pattern MP1 and the second middle conductive pattern MP2 may be disposed spaced apart in the first direction D1 from each other across at least one gate structure GS. The first middle conductive pattern MP1 and the second middle conductive pattern MP2 may each have a bar shape whose major axis extends in the second direction D2 and may be disposed on the second device isolation layer 105. The first middle conductive pattern MP1 and the second middle conductive pattern MP2 may intersect the connection pattern CP.

The first via pattern VP1 and the second via pattern VP2 may be disposed at corresponding intersections between the connection pattern CP and the first middle conductive pattern MP1 and the second middle conductive pattern MP2.

Figure 13A:
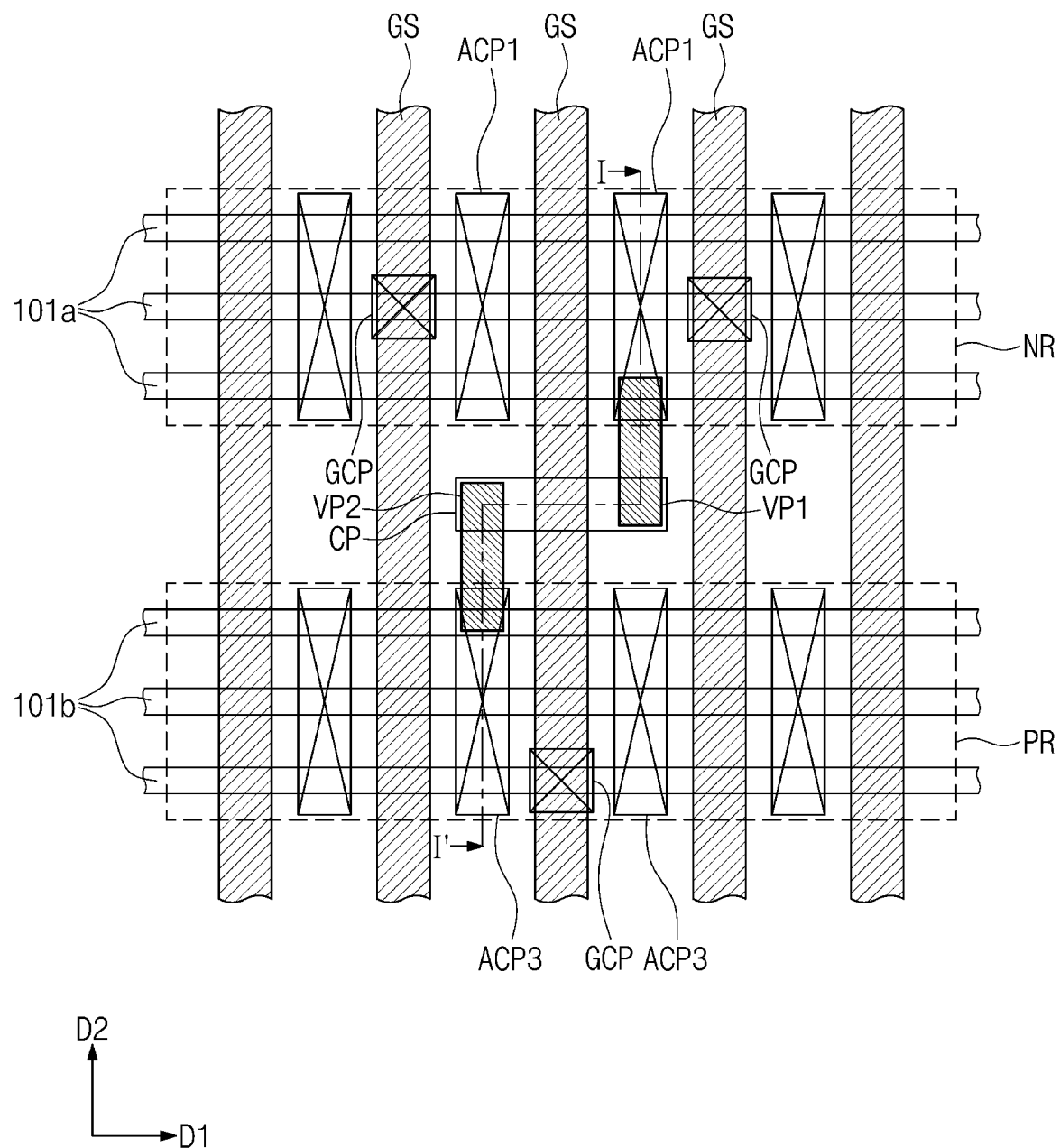
FIG. 13A illustrates a plan view showing a semiconductor device according to some example embodiments of the present disclosure.
Figure 13B:
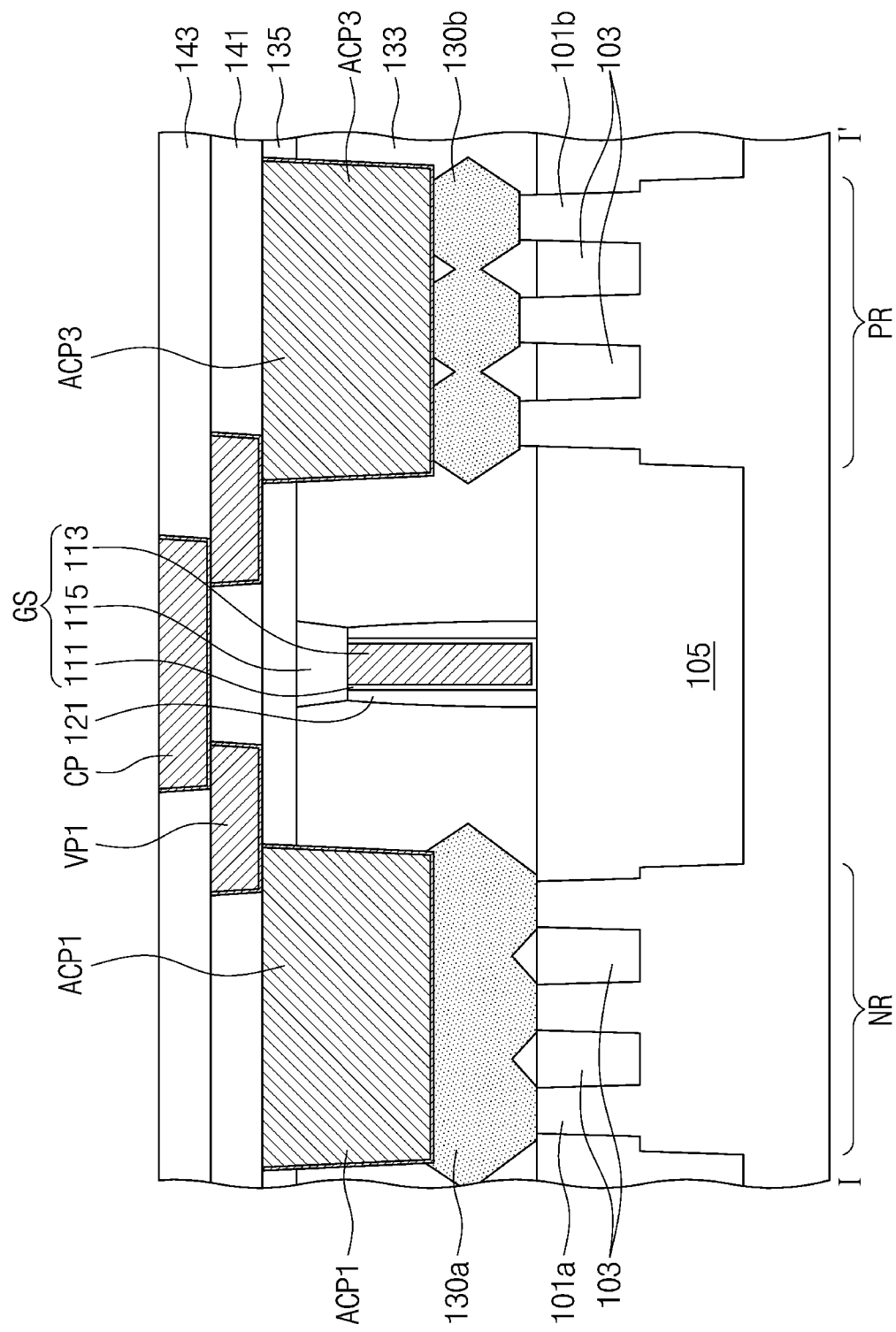
FIG. 13B illustrates a cross-sectional view taken along line I-I' of FIG. 13A, showing a semiconductor device according to some example embodiments of the present disclosure.

FIG. 13A illustrates a plan view showing a semiconductor device according to some example embodiments of the present disclosure. FIG. 13B illustrates a cross-sectional view taken along line I-I' of FIG. 13A, showing a semiconductor device according to some example embodiments of the present disclosure. The same technical features as those of the embodiments discussed above with reference to FIGS. 12A and 12B are omitted in the interest of brevity of description, and differences are discussed below Referring to FIGS. 13A and 13B, on the first active region NR, the first active contact patterns ACP1 having the same length may be disposed between the gate structures GS. On the second active region PR, the third active contact patterns ACP3 having the same length may be disposed between the gate structures GS.

The first via pattern VP1 and the second via pattern VP2 may be disposed in the second interlayer dielectric layer 141 between the first active region NR and the second active region PR. The first via pattern VP1 may contact one of the first active contact patterns ACP1. The second via pattern VP2 may contact one of the third active contact patterns ACP3.

The first via pattern VP1 and the second via pattern VP2 may each have a bar shape whose major axis extends in the second direction D2 and may be disposed on the second device isolation layer 105. For example, the first via pattern VP1 and the second via pattern VP2 may have a primary dimension in the second direction D2 that is larger than any dimension in planes perpendicular to the second direction D2. The first via pattern VP1 and the second via pattern VP2 may intersect the connection pattern CP. The connection pattern CP may be coupled in common to the first via pattern VP1 and the second via pattern VP2.

According to some example embodiments of the present disclosure, a first source/drain pattern of a first active region may be electrically connected to a second source/drain pattern of a second active region through a connection pattern that extends only in a first direction parallel to active patterns. In such cases, an electrical connection path may be reduced between the first source/drain pattern and the second source/drain pattern. Metal patterns may decrease in resistance thereof and capacitance therebetween.

Although the inventive concepts of the present disclosure have been described in connection with some example embodiments as illustrated in the accompanying drawings, it will be understood to those skilled in the art that various changes and modifications may be made without departing from the technical spirit and essential feature of the present disclosure. It will be apparent to those skilled in the art that various substitution, modifications, and changes may be thereto without departing from the scope and spirit of the disclosure.

What is claimed is:

1. A semiconductor device, comprising:
   a substrate that includes a first active region and a second active region, the substrate further including a first active pattern in the first active region and a second active pattern in the second active region;
   a first source/drain pattern and a second source/drain pattern on the first active pattern and the second active pattern, respectively;
   a device isolation layer between the first active region and the second active region;
   a gate structure that extends in a first direction and runs across the first active pattern and the second active pattern;
   a first active contact pattern on the first active region on one side of the gate structure;
   a second active contact pattern on the second active region on another side of the gate structure;
   a third active contact pattern on the first active region on the another side of the gate structure; and
   a connection pattern that overlaps the device isolation layer and connects the first active contact pattern and the second active contact pattern to each other, the connection pattern extending in a second direction and running across the gate structure,
   wherein a top surface of the first active pattern of the substrate is lower than a top surface of the second active pattern of the substrate,
   wherein the top surface of the first active pattern is in contact with a bottom surface of the first source/drain pattern, and the top surface of the second active pattern is in contact with a bottom surface of the second source/drain pattern, and
   wherein the third active contact pattern is spaced apart in the first direction at a first distance from the second active contact pattern, and a width of the connection pattern is less than the first distance.

2. The device of claim 1, wherein the third active contact pattern having a first length in the first direction, and the first and second active contact patterns respectively having a second length greater than the first length in the first direction.

3. The device of claim 1, wherein entire top surface of the first source/drain pattern is in contact with the first active contact pattern, and a portion of a top surface of the second source/drain pattern is spaced apart from the second active contact pattern.

4. The device of claim 1, wherein the connection pattern overlaps a portion of the first active contact pattern and a portion of the second active contact pattern.

5. The device of claim 4, further comprising:
a first via pattern at an intersection between the connection pattern and the first active contact pattern; and
a second via pattern at an intersection between the connection pattern and the second active contact pattern.

6. The device of claim 1, further comprising:
a common via pattern between the connection pattern and the first active contact pattern and the second active contact pattern,
wherein the common via pattern is coupled in common to the first active contact pattern and the second active contact pattern.

7. A semiconductor device, comprising:
a substrate that includes a first active region and a second active region;
a plurality of first active patterns that are on the first active region and extend in a first direction;
a plurality of second active patterns that are on the second active region and extend in the first direction;
a first source/drain pattern on the first active patterns;
a second source/drain pattern on the second active patterns;
a gate structure that runs across the first active patterns and the second active patterns and extends in a second direction intersecting the first direction;
a first active contact pattern on the first active patterns on one side of the gate structure, the first active contact pattern having a first length in the second direction;
a second active contact pattern on the first active patterns on another side of the gate structure, the second active contact pattern having a second length in the second direction, the second length being greater than the first length;
a third active contact pattern on the second active patterns on one side of the gate structure, the third active contact pattern having the second length;
a fourth active contact pattern on the second active patterns on another side of the gate structure, the fourth active contact pattern having the first length; and
a connection pattern that extends in the first direction and runs across the gate structure between the first active region and the second active region, the connection pattern connecting the second active contact pattern to the third active contact pattern,
wherein entire top surface of the first source/drain pattern is in contact with the second active contact pattern, and a portion of a top surface of the second source/drain pattern is spaced apart from the third active contact pattern.

8. The device of claim 7, wherein a bottom surface of the first source/drain pattern is lower than a bottom surface of the second source/drain pattern.

9. The device of claim 7, further comprising:
a gate contact pattern in contact with the gate structure,
wherein a bottom surface of the connection pattern is located at a level higher than a level of a top surface of the gate contact pattern.

10. The device of claim 7, a first via pattern between the first active contact pattern and the connection pattern; and
a second via pattern between the second active contact pattern and the connection pattern,
wherein the first via pattern and the second via pattern have a length in the first direction greater than a length in the second direction.

11. The device of claim 7, wherein the third active contact pattern is spaced apart in the second direction at a first distance from the first active contact pattern, and a width of the connection pattern is less than the first distance.

12. The device of claim 7, wherein each of the second active contact pattern and the third active contact pattern includes a first segment that extends in the second direction and a second segment that protrudes from a portion of the first segment in a third direction perpendicular to a plane formed by the first direction and the second direction,
wherein the connection pattern is in contact with the second segments of the second active contact pattern and the third active contact pattern.

13. The device of claim 7, further comprising:
a device isolation layer between the first active region and the second active region,
wherein the connection pattern overlaps the device isolation layer.

14. A semiconductor device, comprising:
a substrate that includes a first active region and a second active region;
a device isolation layer between the first active region and the second active region;
a gate structure that extends in a first direction and runs across the first active region and the second active region;
a plurality of first source/drain patterns on the first active region on opposite sides of the gate structure;
a plurality of first channel patterns between the first source/drain patterns, the first channel patterns being spaced apart from each other on the first active region in a third direction perpendicular to a plane formed by the first direction and the second direction;
a plurality of second source/drain patterns on the second active region on opposite sides of the gate structure; and
a plurality of second channel patterns between the second source/drain patterns, the second channel patterns being spaced apart from each other in the third direction on the second active region;
a first active contact pattern on the first active region on one side of the gate structure;
a second active contact pattern on the second active region on another side of the gate structure;
a third active contact pattern on the first active region on the another side of the gate structure; and
a connection pattern that is on the device isolation layer and connects the first active contact pattern and the second active contact pattern to each other, the connection pattern extending in a second direction and running across the gate structure,
wherein the gate structure includes a capping dielectric pattern on its upper portion, and a bottom surface of the capping dielectric pattern is rounded.

15. The device of claim 14, wherein entire top surface of each of the first source/drain patterns is in contact with the first active contact pattern, and a portion of a top surface of each of the second source/drain patterns is spaced apart from the second active contact pattern.

16. The device of claim 14, wherein the gate structure includes a gate conductive pattern that surrounds the first channel patterns and the second channel patterns.

17. The device of claim 14, wherein the first active contact pattern is coupled to one of the first source/drain patterns, and
the second active contact pattern is coupled to one of the second source/drain patterns.

18. The device of claim 14, wherein the third active contact pattern is spaced apart in the first direction at a first distance from the second active contact pattern, and a width of the connection pattern is less than the first distance.

19. The device of claim 14, wherein portions of the first active contact pattern and the second active contact pattern extend in the first direction and overlap the device isolation layer.

* * * * *